United States Patent
Kitagawa et al.

(10) Patent No.: US 11,525,567 B2
(45) Date of Patent: Dec. 13, 2022

(54) VENTILATION HOUSING

(71) Applicant: NITTO DENKO CORPORATION, Ibaraki (JP)

(72) Inventors: Daisuke Kitagawa, Osaka (JP); Satoshi Nishiyama, Osaka (JP); Youzou Yano, Osaka (JP); Tomoyuki Kasagi, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 17/283,894

(22) PCT Filed: Oct. 11, 2019

(86) PCT No.: PCT/JP2019/040317
§ 371 (c)(1),
(2) Date: Apr. 8, 2021

(87) PCT Pub. No.: WO2020/075858
PCT Pub. Date: Apr. 16, 2020

(65) Prior Publication Data
US 2021/0356113 A1   Nov. 18, 2021

(30) Foreign Application Priority Data
Oct. 11, 2018  (JP) .............................. JP2018-192353

(51) Int. Cl.
*F21V 31/03*   (2006.01)
*F21S 45/30*   (2018.01)

(52) U.S. Cl.
CPC .............. *F21V 31/03* (2013.01); *F21S 45/30* (2018.01)

(58) Field of Classification Search
CPC ................................ F21V 31/03; F21S 45/30
See application file for complete search history.

(56) References Cited

U.S. PATENT DOCUMENTS 6,364,924 B1    4/2002  Mashiko et al.
2003/0216119 A1  11/2003  Mashiko et al.
(Continued)

FOREIGN PATENT DOCUMENTS

| CN | 101072973 A | 11/2007 |
|---|---|---|
| JP | 2001143524 | 5/2001 |

(Continued)

OTHER PUBLICATIONS

International Search Report and Written Opinion issued for International Patent Application No. PCT/JP2019/040317, dated Dec. 17, 2019, 10 pages including English translation of Search Report.

(Continued)

*Primary Examiner* — Thomas M Sember
(74) *Attorney, Agent, or Firm* — Hamre, Schumann, Mueller & Larson, P.C.

(57) ABSTRACT

A ventilation housing of the present disclosure includes: a housing; and a ventilation assembly. The housing includes a tubular projection extending to project from an outer surface and internally having a first space communicating the inside and the outside of the housing. The ventilation assembly includes: an internal member being a tubular body having an opening at a first end portion and an opening at a second end portion; a gas-permeable membrane covering the opening at the first end portion of the internal member; and an external member being a tubular body having a bottom, the external member being joined to the internal member with the internal member inserted in the interior of the external member from the first end portion side. The ventilation assembly is fixed to the projection with the projection inserted in the opening at the second end portion of the internal member to make an inner peripheral surface of the internal member and an outer peripheral surface of the projection abut each other. The ventilation assembly has a (Continued)

second space serving as a ventilation path connecting the gas-permeable membrane and the outside of the ventilation assembly in the inside of the internal member, the inside of the external member, and/or an interspace between the internal member and the external member joined together. A height H1 of the internal member is 6 to 10 mm. A ratio of the height H1 of the internal member to a height H2 of the projection is 1.00 to 1.70. The ventilation housing of the present disclosure exhibits excellent performance in terms of moisture permeation between the inside and the outside of the housing and is capable of reducing dropping of the ventilation assembly from the projection of the housing.

5 Claims, 24 Drawing Sheets

(56) References Cited

U.S. PATENT DOCUMENTS

| | | | |
|---|---|---|---|
| 2008/0092741 | A1 | 4/2008 | Furuuchi et al. |
| 2009/0084078 | A1 | 4/2009 | Furuyama et al. |

FOREIGN PATENT DOCUMENTS

| | | |
|---|---|---|
| JP | 2003336874 | 11/2003 |
| JP | 2005349362 | 12/2005 |
| JP | 2006032006 | 2/2006 |
| JP | 2007087929 | 4/2007 |

OTHER PUBLICATIONS

Office Action issued for Indian Patent Application No. 202117013282, dated Oct. 17, 2022, 5 pages.

| Ventilation assembly A | Ventilation assembly B | Ventilation assembly C | Ventilation assembly D | Ventilation assembly E |
|---|---|---|---|---|
|  |  |  |  |  |

VENTILATION HOUSING

TECHNICAL FIELD

The present invention relates to a ventilation housing including a ventilation assembly fixed.

BACKGROUND ART

Ventilation assemblies for ensuring ventilation between the inside and the outside of a housing, reducing pressure variation inside the housing, and so on are sometimes fixed to housings of in-vehicle electrical components such as lamps, inverters, converters, electronic control units (ECUs), battery packs, radars, and cameras and various electronic devices for home use, medical use, office use, etc. Ventilation assemblies are required to have, in addition to ventilation properties, various properties such as dust proofness for preventing entry of dust into housings, water proofness for preventing entry of water into housings, oil proofness for preventing entry of oil into housings, and CCT resistance for preventing entry of salt into housings depending on the specific electrical components, etc. to which the ventilation assemblies are fixed.

Patent Literature 1 discloses a ventilation assembly that can satisfy the ventilation properties and the various required properties. FIG. 28 shows the ventilation assembly disclosed in Patent Literature 1.

A ventilation assembly 101 shown in FIG. 28 includes an internal member 102 which is a tubular body having openings at both end portions 108 and 109, a gas-permeable membrane 103 covering the opening at the one end portion 108 of the internal member 102, and an external member 104 which is a tubular body having a bottom. The external member 104 is joined to the internal member 102 with the internal member 102 inserted in the interior of the external member 104 from the end portion 108 side. The external member 104 includes a projecting portion 106 projecting from an inner side 105 of a bottom portion in the direction along the central axis of the ventilation assembly 101. The projecting portion 106 abuts the gas-permeable membrane 103 disposed at the end portion 108 of the internal member 102. Since the projecting portion 106 abuts the gas-permeable membrane 103, the external member 104 and the gas-permeable membrane 103 are kept spaced apart from each other. Between the inner side 105 of the bottom portion of the external member 104 and the gas-permeable membrane 103 and between the outer peripheral surface of the internal member 102 and the inner peripheral surface of the external member 104, the ventilation assembly 101 has a space 107 serving as a ventilation path 115 connecting the exterior of the ventilation assembly 101 and the gas-permeable membrane 103.

The ventilation assembly 101 is fixed to a tubular projection 112 extending to project from the outer surface of a housing 111 and internally having a space 110 communicating the inside and the outside of the housing 111. Specifically, the projection 112 is inserted in the internal member 102 through the opening at the other end portion 109 of the internal member 102 to fix the ventilation assembly 101 to the projection 112. This allows ventilation between the inside and the outside of the housing 111 through the projection 112 and the ventilation assembly 101 with the ventilation assembly 101 fixed.

CITATION LIST

Patent Literature

Patent Literature 1: JP 2003-336874 A

SUMMARY OF INVENTION

Technical Problem

The present invention aims to provide a ventilation housing including a housing and a ventilation assembly, exhibiting excellent performance in terms of moisture permeation between the inside and the outside of the housing, and being capable of reducing dropping of the ventilation assembly from the projection of the housing.

Solution to Problem

The present invention provides a ventilation housing including:
 a housing; and
 a ventilation assembly, wherein
 the housing includes a tubular projection extending to project from an outer surface of the housing and internally having a first space communicating the inside and the outside of the housing,
 the ventilation assembly includes:
  an internal member being a tubular body having an opening at a first end portion and an opening at a second end portion;
  a gas-permeable membrane covering the opening at the first end portion of the internal member; and
  an external member being a tubular body having a bottom, the external member being joined to the internal member with the internal member inserted in the interior of the external member from the first end portion side,
 the ventilation assembly is fixed to the projection with the projection inserted in the opening at the second end portion of the internal member to make an inner peripheral surface of the internal member and an outer peripheral surface of the projection abut each other,
 the ventilation assembly has a second space serving as a ventilation path connecting the gas-permeable membrane and the outside of the ventilation assembly in at least one selected from the inside of the internal member, the inside of the external member, and an interspace between the internal member and the external member joined together,
 a height H1 of the internal member is 6.0 mm or more and 10 mm or less, and
 a ratio H1/H2 of the height H1 of the internal member to a height H2 of the projection is 1.00 or more and 1.70 or less.

Advantageous Effects of Invention

According to a study by the present inventors, the ventilation housing in which the height of the internal member and the ratio of the height of the internal member to the height of the projection are controlled as described above exhibits excellent moisture permeation performance. When simply reduced in height, a conventional ventilation assembly easily drops from a projection of a housing; on the other hand, the ventilation housing controlled as described above can reduce dropping from the projection of the housing.

DESCRIPTION OF EMBODIMENTS

Figure 1A:
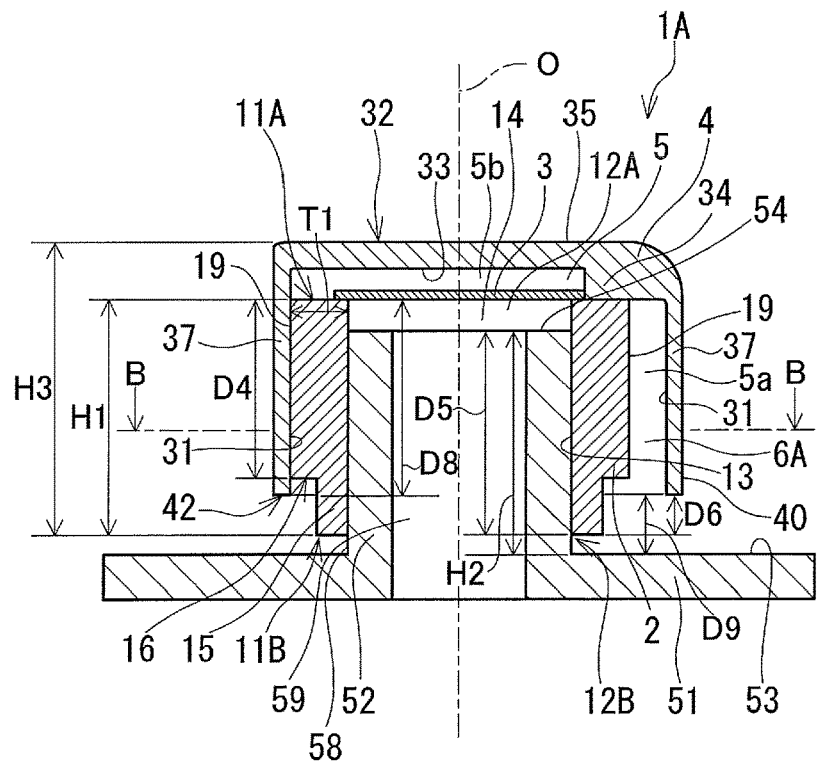
FIG. 1A is a cross-sectional view schematically showing a ventilation assembly of a first embodiment.

A ventilation housing of a first aspect of the present disclosure is a ventilation housing including:

a housing; and a ventilation assembly, wherein the housing includes a tubular projection extending to project from an outer surface of the housing and internally having a first space communicating the inside and the outside of the housing, the ventilation assembly includes:
  an internal member being a tubular body having an opening at a first end portion and an opening at a second end portion;
  a gas-permeable membrane covering the opening at the first end portion of the internal member; and
  an external member being a tubular body having a bottom, the external member being joined to the internal member with the internal member inserted in the interior of the external member from the first end portion side, the ventilation assembly is fixed to the projection with the projection inserted in the opening at the second end portion of the internal member to make an inner peripheral surface of the internal member and an outer peripheral surface of the projection abut each other, the ventilation assembly has a second space serving as a ventilation path connecting the gas-permeable membrane and the outside of the ventilation assembly in at least one selected from the inside of the internal member, the inside of the external member, and an interspace between the internal member and the external member joined together, a height H1 of the internal member is 6.0 mm or more and 10 mm or less, and a ratio H1/H2 of the height H1 of the internal member to a height H2 of the projection is 1.00 or more and 1.70 or less.

According to a second aspect of the present disclosure, in the ventilation housing of the first aspect, a ratio $S2_{min}/S1$ between an area $S1$ of a cross-section of the first space taken along a plane perpendicular to a central axis of the projection and a smallest total area $S2_{min}$ determined by comparison of values of different total areas determined at different distances from the gas-permeable membrane is 1.0 or more, the total areas each being determined for a cross-section(s) of the second space taken along a plane perpendicular to a ventilation direction in the ventilation path, the cross-section(s) being located at a certain distance from the gas-permeable membrane.

According to a third aspect of the present disclosure, in the ventilation housing of the first or second aspect, a ratio $S2_{out}/S1$ between an area $S1$ of a cross-section of the first space taken along a plane perpendicular to a central axis of the projection and a total area $S2_{out}$ of a plane consisting of a cross-section(s) of the second space taken at a position(s) where the second space is the narrowest when the second space is observed from the second end portion side along a central axis of the ventilation assembly is 1.0 or more.

According to a fourth aspect of the present disclosure, in the ventilation housing of any one of the first to third aspects, when the ventilation assembly is observed in a direction perpendicular to a central axis of the ventilation assembly, a length of a portion of the internal member in a direction along the central axis is 6.0 mm or more and 8.0 mm or less, the portion being covered by the external member.

According to a fifth aspect of the present disclosure, in the ventilation housing of any one of the first to fourth aspects, the external member and/or the internal member has a locking mechanism detachably joining the external member and the internal member together.

Embodiments of the present invention will be described hereinafter with reference to the accompanying drawings. The following description is not intended to limit the present invention to particular embodiments.

First Embodiment

Figure 1B:
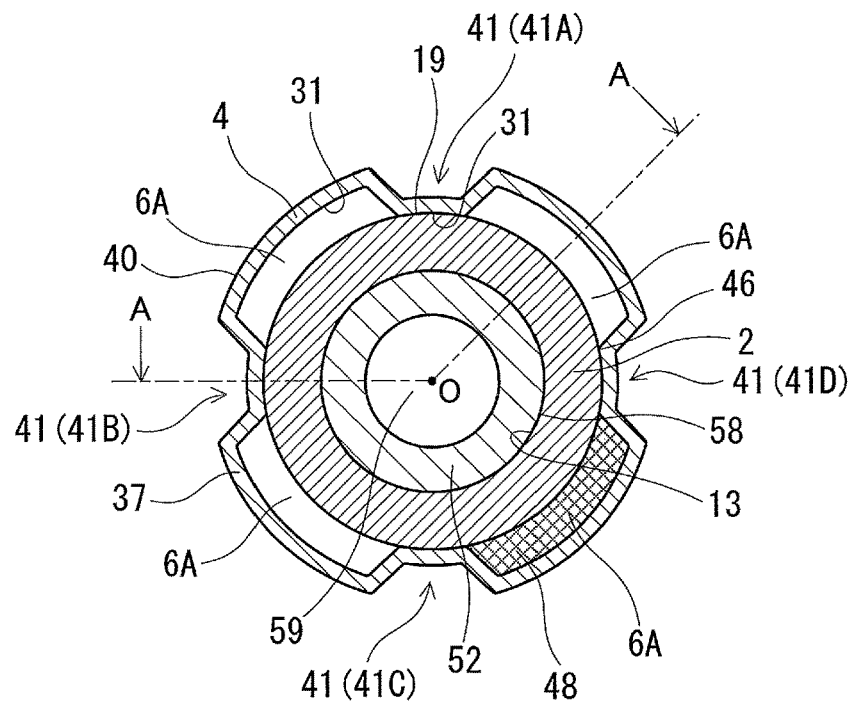
FIG. 1B is a cross-sectional view schematically showing the ventilation assembly of the first embodiment.
Figure 2:
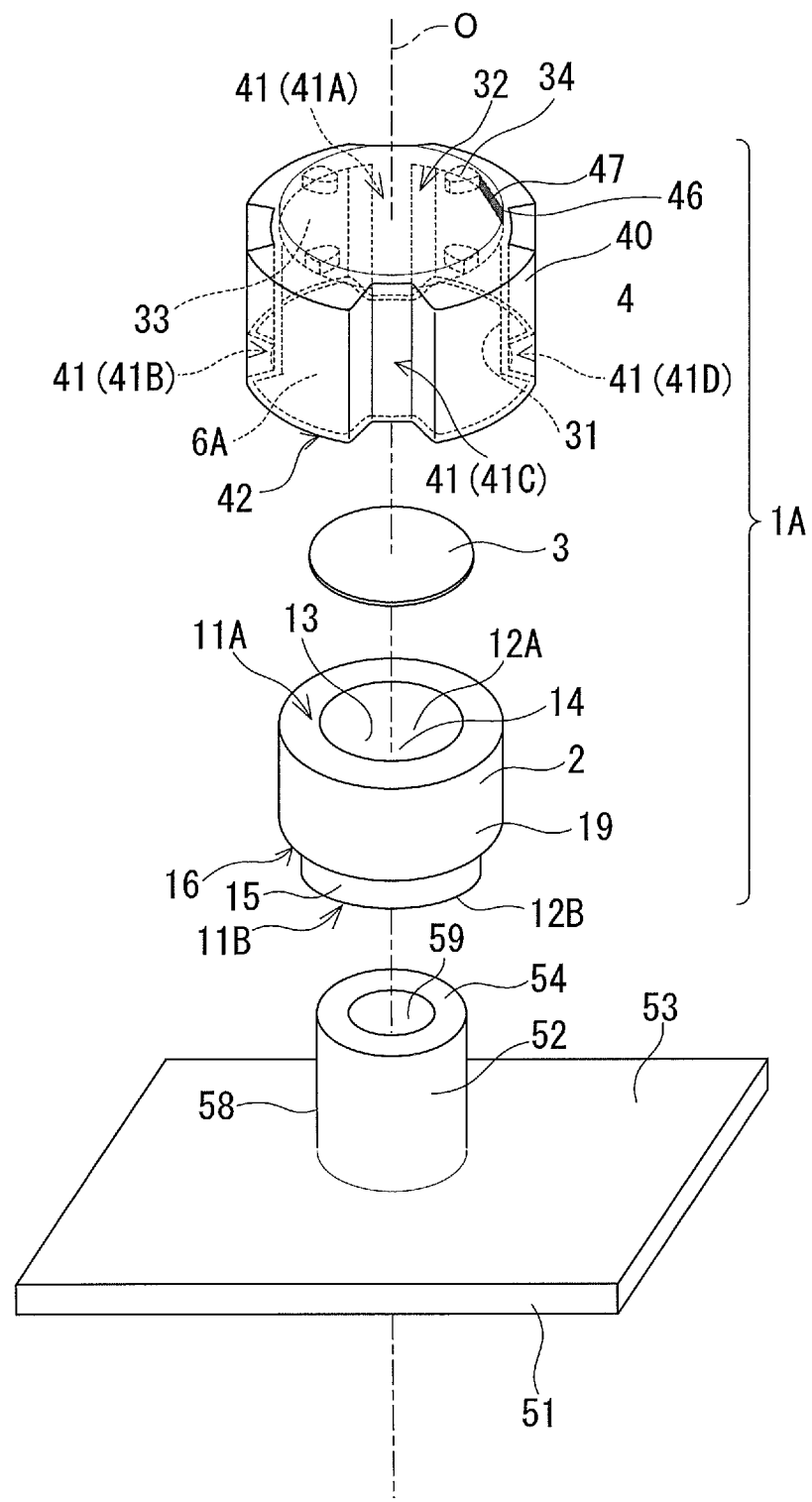
FIG. 2 is an exploded perspective view schematically showing the ventilation assembly of the first embodiment.

FIGS. 1A and 1B show a ventilation assembly 1A of a first embodiment. FIG. 1B shows a cross-section B-B of the ventilation assembly 1A shown in FIG. 1A. FIG. 1A shows a cross-section A-O-A of the ventilation assembly 1A shown in FIG. 1B. "O" in FIG. 1B indicates the central axis of the ventilation assembly 1A. FIGS. 1A and 1B show a state where the ventilation assembly 1A is fixed to a projection 52 of a housing 51, in other words, the vicinity of the projection 52 of the housing 51 in a ventilation housing including the ventilation assembly 1A fixed to the projection 52. FIG. 2 shows an exploded perspective view of the ventilation assembly 1A shown in FIGS. 1A and 1B. As shown in FIGS. 1A, 1B, and 2, the ventilation assembly 1A is fixed to the tubular projection 52 extending to project from an outer surface 53 of the housing 51 and internally having a first space 59 communicating the inside and the outside of the housing 51.

The ventilation assembly 1A includes an internal member 2, a gas-permeable membrane 3, and an external member 4. The internal member 2 is a tubular body having an opening 12A at an end portion 11A and an opening 12B at an end portion 11B that is opposite to the end portion 11A. The internal member 2 has an open tubular structure in which both end portions have openings. The gas-permeable membrane 3 is disposed at the one end portion 11A of the internal member 2 so as to cover the opening 12A at the end portion 11A. The external member 4 is a tubular body having a bottom. The external member 4 has a closed tubular structure in which one end portion 42 has an opening and the other end portion has a closed opening closed by a bottom portion 32. The external member 4 is joined to the internal member 2 with the internal member 2 inserted in the interior of the external member 4 from the end portion 11A side where the gas-permeable membrane 3 is disposed. Here, the interior of the external member 4 refers to a space surrounded by the opening of the external member 4 and an inner peripheral surface 31. The external member 4 covers the gas-permeable membrane 3 so as to function as a cover that protects the gas-permeable membrane 3 from foreign matters such as dust and water coming from the outside.

The ventilation assembly 1A has a second space 5 serving as a ventilation path connecting the gas-permeable membrane 3 and the outside of the ventilation assembly 1A. The ventilation assembly 1A has a space 5a, which is a part of the second space 5, between an outer peripheral surface 40 of the external member 4 joined to the internal member 2 and an inner peripheral surface 13 of the internal member 2. The ventilation assembly 1A also has the space 5a between the internal member 2 and the external member 4 joined together, more specifically, between the inner peripheral surface 31 of the external member 4 and an outer peripheral surface 19 of the internal member 2. In the ventilation assembly 1A, an inner side 33 of the bottom portion 32 of the external member 4 and the gas-permeable membrane 3 are spaced apart from each other. The ventilation assembly 1A has a space 5b, which is a part of the second space 5, between the inner side 33 and the gas-permeable membrane 3 spaced apart from each other. The term "ventilation path" refers to a route through which gas can move between the gas-permeable membrane and the outside of the ventilation assembly. The term "ventilation path" refers to, for example, a gas flow route allowing air having permeated through the gas-permeable membrane 3 and reached the space 5b to pass through the space 5b and then the space 5a and eventually reach the outside of the ventilation assembly 1A. Therefore, such a space as the space 5a can be a "ventilation path" not only when located between the internal member 2 and the external member 4 joined together but also when located inside the internal member 2 or the external member 4. It should be noted that the ventilation path is determined for the ventilation assembly obtained when the internal member 2 is inserted as deep in the external member 4 as possible.

The ventilation assembly 1A is fixed to the projection 52 of the housing 51 with the projection 52 inserted in the internal member 2 through the opening 12B at the other end portion 11B of the internal member 2 to make the inner peripheral surface 13 of the internal member 2 and an outer peripheral surface 58 of the projection 52 abut each other. The projection 52 is inserted in a through hole 14 of the internal member 2 to fix the ventilation assembly 1A. The through hole 14 is a space connecting the end portions 11A and 11B and surrounded by the inner peripheral surface 13 of the internal member 2. In a ventilation housing including the ventilation assembly 1A fixed to the projection 52, ventilation between the inside and the outside of the housing 51 can be ensured through the first space 59 in the interior of the projection 52, the through hole 14 of the internal member 2, the gas-permeable membrane 3, and the second space 5.

A thickness T1 of the internal member 2 may be 1.0 mm or more and 3.0 mm or less, the thickness T1 being the distance between the inner peripheral surface 13 and the outer peripheral surface 19. The lower limit of the thickness T1 may be 1.1 mm or more, 1.2 mm or more, or even 1.3 mm or more. The upper limit of the thickness T1 may be 2.9 mm or less, 2.8 mm or less, or even 2.7 mm or less. The internal member 2 having a thickness T1 within these ranges ensures sufficient strength of the internal member 2 while allowing a reduction in the height of the ventilation assembly 1A. For example, breaking, tearing, and the like of the internal member 2 can be prevented at the time of joining the external member 4 to the internal member 2. It should be noted that the thickness T1 is determined for the internal member 2 in which the projection 52 has not been inserted.

The internal member 2 of the first embodiment has a thin portion 15 having a decreased thickness T1 and extending from the end portion 11B from which the projection 52 is inserted at the time of fixation of the ventilation assembly 1A to a given height in the direction along the central axis O. Moreover, the internal member 2 has a step 16 at the boundary between the thin portion 15 and the rest of the internal member 2. The step 16 is located farther from the outer surface 53 of the housing 51 than the end portion 42 of the external member 4 on the opening side is (the step 16 is located on the upper side of the ventilation assembly 1A with respect to the end portion 42). However, the position of the step 16 is not limited to this example. When the internal member 2 has the thin portion 15, it is easier to insert the projection 52 of the housing 51 in the ventilation assembly 1A. This effect is particularly advantageous when the internal member 2 has a small inner diameter, for example, due to a reduction in height, in other words, when it is difficult for the end portion 11B of the internal member 2 to stretch at the time of insertion of the projection 52. The internal member 2 does not have the thin portion 15 on the end portion 11A side where the gas-permeable membrane 3 is disposed, and that can prevent an inclination of the external member 4 and the internal member 2 to each other at the time of joining the members 2 and 4 together and an inclination of the internal member 2 at the time of inserting the projection 52 of the housing 51. This effect is particularly advantageous when the internal member 2 has a small thickness T1. In the example shown in FIGS. 1A, 1B, and 2, the peripheral surface of the thin portion 15 and the outer peripheral surface 19 are connected at the step 16 by a plane perpendicular to the central axis O. The plane connecting the peripheral surface of the thin portion 15 and the outer peripheral surface 19 at the step 16 may be inclined to the direction perpendicular to the central axis O.

A height H1 of the internal member 2 is 6.0 mm or more and 10 mm or less, the height H1 being the distance between the end portions 11A and 11B of the internal member 2 in the direction along the central axis O. The upper limit of the height H1 may be 9.5 mm or less, 9.0 mm or less, or even 8.5 mm or less. The lower limit of the height H1 may be 6.5 mm or more, 7.0 mm or more, or even 7.5 mm or more. Because the height H1 is in these ranges, the housing 51 exhibits excellent moisture permeation performance, compared to conventional ones. The central axis O of the ventilation assembly 1A is, more specifically, the central axis of the internal member 2. The central axis of the projection 52 commonly coincides with the central axis O of the ventilation assembly 1A.

The internal member 2 and the projection 52 of the first embodiment are each in the shape of a cylinder. Because the material of the internal member 2 is commonly an elastic body, the inner peripheral surface 13 of the internal member 2 commonly has a diameter equal to or smaller than the diameter of the outer peripheral surface 58 of the projection 52. It should be noted that the elastic modulus of the elastic body forming the internal member 2 and/or the diameter of the inner peripheral surface 13 of the internal member 2 can be controlled, for example, in consideration of ease of insertion of the projection 52 into the internal member 2, sealing properties between the housing 51 and the ventilation assembly 1A, and the like. The shape of the internal member 2 which is a tubular body and the shape of the tubular projection 52 are not limited to a cylinder.

The inner diameter of the cylindrical internal member 2 is, for example, 6.0 to 8.0 mm. Half the value obtained by subtracting the inner diameter of the cylindrical internal member 2 from the outer diameter thereof corresponds to the thickness T1.

The external member 4 is in the shape of a cylinder having a bottom. When the external member 4 is observed along the central axis O, a portion of a peripheral wall 37 of the external member 4 projects toward the interior of the external member 4, more specifically, toward the central axis O. As the peripheral wall 37 projects in the above manner, the external member 4 includes, on the outer peripheral surface 40, a plurality of grooves 41 (41A, 41B, 41C, and 41D) extending along the central axis O. In the example shown in FIGS. 1A, 1B, and 2, the grooves 41 are provided at regular intervals in the peripheral direction of the external member 4 when observed along the central axis O, and the grooves 41 extend from the end portion 42 of the external member 4 on the opening side to the bottom portion 32. In the external member 4, the thickness of the peripheral wall 37 at each of groove 41 portions and that at each of portions other than the groove 41 portions are substantially uniform. However, the positions which are on the outer peripheral surface 40 and where the grooves 41 are provided, the intervals between the adjacent grooves 41, the directions in which the grooves 41 extend, and zones where the grooves 41 extend and which are present between the end portion 42 and the bottom portion 32 of the external member 4 are not limited to those in the above example. The thickness of the peripheral wall 37 at each groove 41 portion and that at each portion other than the groove 41 portions may be different.

At the groove 41 portions, the inner peripheral surface 31 of the external member 4 coincides with the peripheral surface of a virtual column A having the central axis O as its central axis. The internal member 2 and the external member 4 are joined to each other by making the outer peripheral surface 19 and the inner peripheral surface 31 at the groove 41 portions abut each other. Because the material of the internal member 2 is commonly an elastic body, the virtual column A commonly has a diameter equal to or smaller than the diameter of the outer peripheral surface 19. Gaps 6A between the inner peripheral surface 31 of the external member 4 at the portions other than the groove 41 portions and the outer peripheral surface 19 of the internal member 2 are each a part of the space 5a. In the example shown in FIGS. 1A, 1B, and 2, the outer peripheral surface 19 of the internal member 2 does not have a protruding portion projecting from the surface 19. The outer peripheral surface 19 forms the entire peripheral surface of the column in the peripheral direction of the surface 19. In the example shown in FIGS. 1A, 1B, and 2, the number of the gaps 6A is four. In the first embodiment, the number of the gaps 6A is required to be one or two or more and may be two to eight or even three to six.

When the ventilation assembly 1A is observed in the direction perpendicular to the central axis O, a length D8 of a portion of the internal member 2 in the direction along the central axis O, the portion being covered by the external member 4, may be, for example, 3.5 mm or more and 9.5 mm or less or may be 6.0 mm or more and 8.0 mm or less.

The lower limit of the length D8 may be 4.0 mm or more, 4.5 mm or more, or even 5.0 mm or more. The upper limit of the length D8 may be 9.0 mm or less, 8.5 mm or less, or even 8.0 mm or less. When the length D8 is in these ranges, the internal member 2 and the external member 4 are more reliably joined together and the external member 4 is unlikely to drop from the internal member 2, for example, at the time of fixation of the ventilation assembly 1A to the projection 52 of the housing 51. Moreover, sufficient moisture permeation performance can be ensured. Furthermore, entry of foreign matters such as dust and water from the outside of the ventilation assembly 1A into the second space 5 can be reduced. It should be noted that the length D8 is determined when the internal member 2 is inserted as deep in the external member 4 as possible.

For the internal member 2 and the external member 4 joined by making them abut each other, a length (inside-outside contact length) D4 in the direction along the central axis O is, for example, 4.0 to 8.0 mm, the length D4 of a portion where the internal member 2 and the external member 4 abut each other, more specifically, the length D4 of a portion where the outer peripheral surface 19 of the internal member 2 and the inner peripheral surface 31 of the external member 4 at the groove 41 portion abut each other. When the length D4 is in these ranges, the internal member 2 and the external member 4 are more reliably joined together and the external member 4 is unlikely to drop from the internal member 2, for example, at the time of fixation of the ventilation assembly 1A to the projection 52 of the housing 51. In the example shown in FIGS. 1A, 1B, and 2, a portion of the internal member 2, the portion abutting the inner peripheral surface 31 of the external member 4, extends in the direction along the central axis O from the end portion 11A where the gas-permeable membrane 3 is disposed to the step 16, in other words, to the lower end of the portion other than the thin portion 15. The portion of the internal member 2, the portion abutting the inner peripheral surface 31, spans the entire outer peripheral surface 19 in the peripheral direction.

A distance D6 in the direction along the central axis O and between the end portion (lower end) 42 on the opening side of the external member 4 and the end portion 11B of the internal member 2 is, for example, 0 to 3.0 mm, and may be 0.2 to 2.0 mm or even 0.4 to 1.0 mm. When the distance D6 is in these ranges, the internal member 2 and the external member 4 are more firmly joined together. It should be noted that the distance D6 is determined when the internal member 2 is inserted as deep in the external member 4 as possible.

The external member 4 includes two or more second projecting portions 34 projecting from the inner side 33 of the bottom portion 32 in the direction along the central axis O. Each of the second projecting portions 34 also projects from the inner peripheral surface 31 of the external member 4 toward the central axis O when observed along the central axis O. In a state where the external member 4 and the internal member 2 are joined together, the inner side 33 of the bottom portion 32 of the external member 4 and the gas-permeable membrane 3 are kept spaced apart from each other by making the second projecting portions 34 and the end portion 11A of the internal member 2 abut each other. The second projecting portions 34 may be provided in such a manner that in a state where the external member 4 and the internal member 2 are joined together, the second projecting portions 34 abut the gas-permeable membrane 3 or abut both the internal member 2 and the gas-permeable membrane 3.

A height H3 of the ventilation assembly 1A is, for example, 6.0 mm or more and 12 mm or less, the height H3 being the distance between a virtual plane being perpendicular to the central axis O and passing through the lowermost point in the ventilation assembly 1A and a virtual plane being perpendicular to the central axis O and passing through the uppermost point in the ventilation assembly 1A. The upper limit of the height H3 may be 11 mm or less, 10.5 mm or less, or even 10 mm or less. The lower limit of the height H3 may be 6.5 mm or more, 7.0 mm or more, or even 7.5 mm or more. It should be noted that the height H3 is determined when the internal member 2 is inserted as deep in the external member 4 as possible. In the example shown in FIGS. 1A, 1B, and 2, the lowermost point is located at the end portion 11B of the internal member 2, and the uppermost point is located at an outer side 35 of the bottom portion 32 of the external member 4.

An area S1 of a cross-section of the first space 59 taken along a plane perpendicular to the central axis of the projection 52 may be 5 mm$^2$ or more and 60 mm$^2$ or less. The lower limit of the area S1 may be 10 mm$^2$ or more, 12 mm$^2$ or more, 14 mm$^2$ or more, or even 16 mm$^2$ or more. The upper limit of the area S1 may be 50 mm$^2$ or less, 40 mm$^2$ or less, 30 mm$^2$ or less, or even 20 mm$^2$ or less. The central axis of the projection 52 commonly coincides with the central axis O of the ventilation assembly 1A.

In a state where the ventilation assembly 1A is fixed to the projection 52 of the housing 51, a ratio $S2_{min}/S1$ of an area $S2_{min}$ of a cross-section(s) of the second space 5 to the area S1 of the cross-section of the first space 59 is, for example, 0.8 or more. The lower limit of the ratio $S2_{min}/S1$ may be 1.0 or more, 1.1 or more, 1.2 or more, 1.3 or more, or even 1.4 or more. The upper limit of the ratio $S2_{min}/S1$ is, for example, 3.0 or less and may be 2.5 or less or even 2.0 or less. The ventilation assembly and the ventilation housing having a ratio $S2_{min}/S1$ in the above range are excellent in ventilation properties and/or moisture permeation performance. The area S1 is the area of the cross-section of the first space 59 taken along a plane perpendicular to the central axis of the projection 52. The area $S2_{min}$ is a smallest total area determined by comparison of values of different total areas determined at different distances from the gas-permeable membrane is 1.0 or more, the total areas each being determined for a cross-section(s) of the second space 5 taken along a plane perpendicular to a ventilation direction in the ventilation path, the cross-section(s) being located at a certain distance from the gas-permeable membrane. The term "ventilation path" refers to a path through which gas can move between the gas-permeable membrane and the outside of the ventilation assembly. The term "ventilation direction" refers to the direction in which gas should go at a particular position in the second space regarded as the ventilation path. Thus, the ventilation direction varies depending on the position in the second space. The expression "total area determined for cross-sections located at a certain distance from the gas-permeable membrane" is based on the viewpoint that the sum of areas of cross-sections of the second space 5 taken at a group of positions to which the distance (in the case of a point-symmetric gas-permeable membrane, the distance from the center of the gas-permeable membrane) from the gas-permeable membrane is the same is regarded as a total area. Of different total areas determined at different distances in such a manner, a total area of a cross-section(s) taken at a position(s) where the total area value is the smallest is the area $S2_{min}$. The area $S2_{min}$ is determined when the internal member 2 is inserted as deep in the external member 4 as possible. In the example shown in FIGS. 1A, 1B, and 2, the cross-sections whose areas compose the area $S2_{min}$ are each surrounded by the second projecting portion 34, a peripherally end portion 46 of a portion which is included in the groove 41 and where the internal member 2 and the external member 4 abut each other, the inner side 33 of the bottom portion 32 of the external member 4, and the end portion 11A of the internal member 2 (refer to a cross-section 47 in FIG. 2). FIG. 2 shows a part of the cross-sections whose areas compose the area $S2_{min}$ (only the cross-section 47 located between one second projecting portion 34 and one end portion 46). Because the cross-sections whose areas compose the area $S2_{min}$ are present between four second projecting portions 34 and eight end portions 46, eight times the area of the cross-section 47 corresponds to the area $S2_{min}$. The area $S2_{min}$ can be evaluated, for example, by a method described in EXAMPLES.

In a state where the ventilation assembly 1A is fixed to the projection 52 of the housing 51, a ratio $S2_{out}/S1$ of an area $S2_{out}$ of a cross-section(s) of the second space 5 to the area S1 of the cross-section of the first space 59 is, for example, 0.8 or more, and may be 1.0 or more, 1.2 or more, 1.3 or more, 1.5 or more, 1.8 or more, 2.0 or more, or even 2.2 or more. The upper limit of the ratio $S2_{out}/S1$ is, for example, 4.0 or less and may be 3.0 or less. The ventilation assembly and the ventilation housing having a ratio $S2_{out}/S1$ in the above range are excellent in ventilation properties and/or moisture permeation performance. The area $S2_{out}$ is a total area of a plane consisting of a cross-section(s) of the second space 5 taken at a position(s) where the second space 5 within the observable range is the narrowest when the second space 5 is observed from the other end portion 11B side along the central axis of the ventilation assembly 1A. The area $S2_{out}$ is determined when the internal member 2 is inserted as deep in the external member 4 as possible. In the example shown in FIGS. 1A, 1B, and 2, the cross-sections whose areas compose the area $S2_{out}$ are each surrounded by the inner peripheral surface 31 of the external member 4 and the outer peripheral surface 19 of the internal member 2 (refer to a cross-section 48 in FIG. 1B). FIG. 1B shows a part of the cross-sections whose areas compose the area $S2_{out}$ (only the cross-section 48 located between a pair of the adjacent grooves 41C and 41D). Because the cross-sections whose areas compose the area $S2_{out}$ are located between the four grooves 41, four times the area of the cross-section 48 corresponds to the area $S2_{out}$. The area $S2_{out}$ can be evaluated, for example, by a method described in EXAMPLES.

Resins, such as polyamide, polycarbonate, and polybutylene terephthalate, having a relatively high hygroscopicity are sometimes included in housings of electrical components and electronic devices. A housing including any of such resins absorbs surrounding water vapor. The absorbed water vapor is emitted by heat from a heat source inside the housing or heat from the outside, such as sunlight, and a portion of the emitted water vapor remains inside the housing. It is desirable that the water vapor remaining inside the housing be immediately discharged to the outside of the housing through the projection 52 and the ventilation assembly 1A in order to prevent fogging inside the housing. The ventilation assembly and/or ventilation housing having excellent moisture permeation performance, for example, can reduce fogging inside the housing and promote removal of fogging inside the housing.

A height H2 of the projection 52 being the distance in the direction along the central axis O from the outer surface 53 of the housing 51 to the front end 54 of the projection 52 is, for example, 5.0 to 12 mm and may be 4.0 mm or more and 8.0 mm or less.

A ratio H1/H2 of the height H1 of the internal member 2 to the height H2 of the projection 52 is 1.00 or more and 1.70 or less. The lower limit of the ratio H1/H2 may be more than 1.00, 1.02 or more, 1.04 or more, 1.06 or more, 1.08 or more, or even 1.10 or more. The upper limit of the ratio H1/H2 may be 1.60 or less, 1.50 or less, 1.40 or less, 1.30 or less, 1.25 or less, 1.22 or less, 1.20 or less, 1.18 or less, 1.16 or less, or even 1.14 or less. The ventilation assembly and the ventilation housing having a ratio H1/H2 in the above range can effectively reduce dropping of the ventilation assembly from the projection of the housing. When the ventilation assembly 1A is used, the projection 52 is inserted in the ventilation assembly 1A through the opening 12B at the other end portion 11B of the internal member 2. The ratio H1/H2 is determined for the ventilation assembly 1A obtained when the projection 52 is inserted as deep in the internal member 2 as possible.

In the case where the internal member 2 is fixed to the projection 52, a distance D9 between the outer surface 53 of the housing 51 and the end portion 42 of the external member 4 on the opening side is, for example, 0.5 mm or more and 4.0 mm or less. In the case where the distance D9 is in this range, an appropriate gas permeation amount can be ensured while dropping of the ventilation assembly 1A from the projection 52 of the housing 51 is prevented. It should be noted that the distance D9 is determined when the internal member 2 is inserted as deep in the external member 4 as possible.

The gas-permeable membrane 3 is a membrane that allows gas (typically air) to permeate therethrough in its thickness direction and that prevents foreign matters from permeating therethrough. Therefore, the ventilation assembly 1A ensures ventilation between the inside and the outside of the housing 51 and can prevent entry of foreign matters such as dust, water, oil, and salt into the inside of the housing 51. In the first embodiment, the shape of the gas-permeable membrane 3 is a circle. However, the shape of the gas-permeable membrane 3 is not limited to a circle and can be selected according to the shape of a portion which is included in the internal member 2 and where the gas-permeable membrane 3 is disposed. The shape of the gas-permeable membrane 3 may be, for example, a polygon.

In the first embodiment, the gas-permeable membrane 3 is disposed on the end face of the end portion 11A of the internal member 2. However, in the ventilation assembly and the ventilation housing of the present invention, the position where the gas-permeable membrane 3 is disposed is not limited to the end face of the end portion 11A as long as the gas-permeable membrane 3 covers the opening 12A at the end portion 11A.

A woven fabric, non-woven fabric, mesh, or net formed of a resin or metal or a porous resin membrane can be used as the gas-permeable membrane 3. However, the gas-permeable membrane 3 is not limited as long as the gas-permeable membrane 3 allows gas to permeate therethrough and can prevent foreign matters such as liquid from permeating therethrough. In the first embodiment, the gas-permeable membrane 3 used is a laminate of a porous resin membrane and a gas-permeable reinforcing layer. The reinforcing layer can improve the strength of the gas-permeable membrane 3. The porous resin membrane is, for example, a porous body which is formed of a fluorine resin or polyolefin and which can be manufactured by a commonly-known stretching or extraction technique. Examples of the fluorine resin include polytetrafluoroethylene (PTFE), polychlorotrifluoroethylene, tetrafluoroethylene-hexafluoropropylene copolymer, tetrafluoroethylene-perfluoroalkyl vinyl ether copolymer, and tetrafluoroethylene-ethylene copolymer. Examples of the monomer forming the polyolefin include ethylene, propylene, 4-methylpentene-1,1-butene, and a polyolefin that is a homopolymer or copolymer of any of these monomers can be used as the gas-permeable membrane 3. A porous nanofiber film including polyacrylonitrile, nylon, or polylactic acid may be used as the gas-permeable membrane 3. A porous PTFE body capable of ensuring gas permeability with a small area and having a high ability to prevent entry of foreign matters into the inside of the housing 51 is particularly preferably used as the gas-permeable membrane 3. The average pore diameter of the porous PTFE body is preferably 0.01 µm or more and 10 µm or less. The reinforcing layer is formed of, for example, a woven fabric, non-woven fabric, mesh, net, sponge, foam, or porous body formed of a resin or metal. The porous resin membrane and the reinforcing layer can be laminated by a method such as adhesive lamination, thermal lamination, heat welding, ultrasonic welding, and bonding using an adhesive.

The gas-permeable membrane 3 may have been subjected to a liquid-repellent treatment. The liquid-repellent treatment of the gas-permeable membrane 3 can be performed by applying a liquid-repellent agent containing a substance having a small surface tension to the gas-permeable membrane and drying the coating film formed by the application. As the substance described above, the liquid-repellent agent contains, for example, a polymer having a perfluoroalkyl group. The liquid-repellent agent can be applied by a method such as air spraying, electrostatic spraying, dip coating, spin coating, roll coating, curtain flow coating, or impregnation.

The thickness of the gas-permeable membrane 3 can be adjusted, for example, in the range of 1 µm or more and 5 mm or less in consideration of the strength and ease of fixation to the internal member 2. The gas permeation rate of the gas-permeable membrane 3 is, for example, 0.1 to 300 sec/100 mL as expressed by the air permeation rate (Gurley permeability) measured according to Method B (Gurley method) of air permeability measurement specified in Japanese Industrial Standards (JIS) L 1096.

The gas-permeable membrane 3 may be joined to the internal member 2. The gas-permeable membrane 3 can be joined to the internal member 2, for example, by any of various welding methods such as thermal welding, ultrasonic welding, and laser welding. The gas-permeable membrane 3 may be joined to the internal member 2 using an adhesive or pressure-sensitive adhesive. The gas-permeable membrane 3 may be disposed at the end portion 11A of the internal member 2 by insert molding of the gas-permeable membrane 3 in conjunction with the internal member 2.

The material of the internal member 2 is commonly an elastic body. The material of the external member 4 is typically a resin. These members can be formed by a commonly-known molding method such as injection molding, compression molding, or powder molding. The internal member 2 and the external member 4 are preferably molded by injection molding because in that case, efficiency of mass production of the ventilation assembly 1A can be improved. Examples of the elastic body that can form the internal member 2 include an elastomer (elastic resin). The elastomer may be a rubber. Examples of the elastomer include nitrile rubber (NBR), ethylene-propylene rubber (EPDM), silicone rubber, fluorine rubber, acrylic rubber, hydrogenated rubber, and various thermoplastic elastomers. Examples of the resin that can form the external member 4 include thermoplastic resins and the above elastomers. Examples of the thermoplastic resin include polyamide (PA) such as nylon, polybutylene terephthalate (PBT), polyethylene terephthalate (PET), polyphenylene sulfide (PPS), polycarbonate (PC), polypropylene (PP), and polyphenylene ether (PPE). The internal member 2 and the external member 4 may be formed of the same material.

The elastic body forming the internal member 2 and/or the resin forming the external member 4 may include an additive, for example, a pigment such as carbon black or titanium white, a reinforcing filler such as glass particles or glass fibers, or a water-repellent agent. A surface of the internal member 2 and/or that of the external member 4 may have at least partially been subjected to the liquid-repellent treatment. The liquid-repellent treatment can be performed, for example, by forming a coating by any of the methods described above as the liquid-repellent treatment method for the gas-permeable membrane 3, electrodeposition coating, or plasma polymerization.

The internal member 2 and/or the external member 4 may include a locking mechanism detachably joining the internal member 2 and the external member 4 together. The locking mechanism is formed of, for example, a claw portion, a screw portion, or a fitting portion.

The housing 51 is formed of, for example, a resin, a metal, or a composite material thereof. The same applies to the projection 52. The resin forming the projection 52 is commonly not an elastic body. Examples of the resin forming the projection 52 include a thermoplastic resin (excluding elastic bodies) and thermosetting resin. Examples of the thermoplastic resin include the various thermoplastic resins mentioned as examples of the resin that can form the external member 4 and acrylonitrile-butadiene-styrene copolymer resin (ABS). The structure of the housing 51 is not limited as long as the projection 52 is included.

Second Embodiment

Figure 3A:
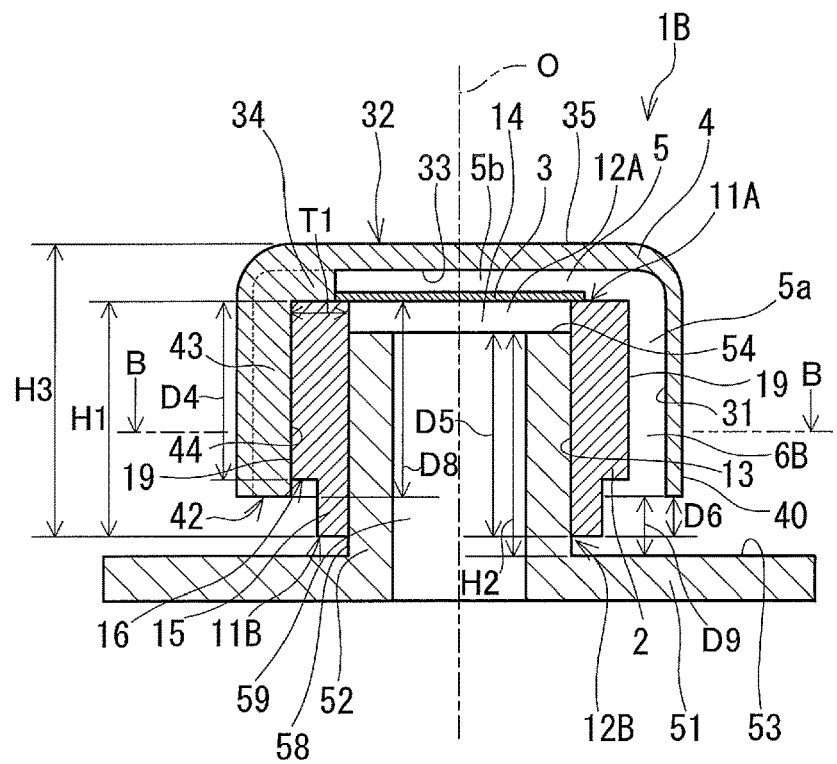
FIG. 3A is a cross-sectional view schematically showing a ventilation assembly of a second embodiment.
Figure 3B:
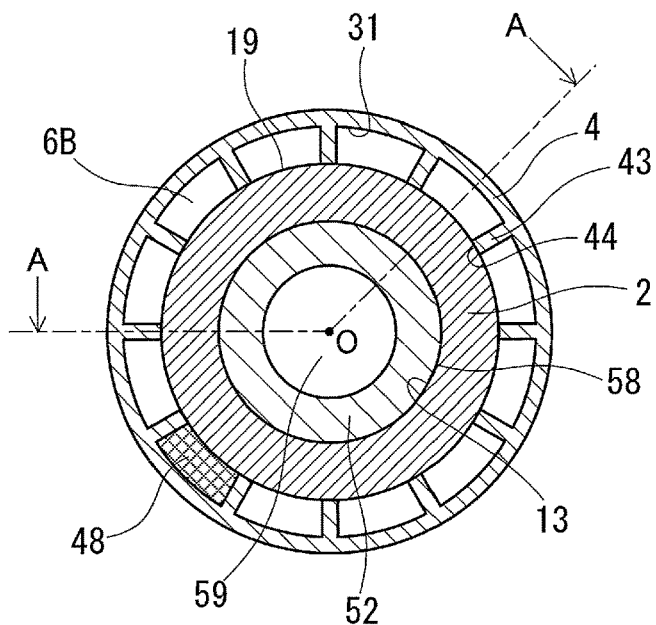
FIG. 3B is a cross-sectional view schematically showing the ventilation assembly of the second embodiment.
Figure 4:
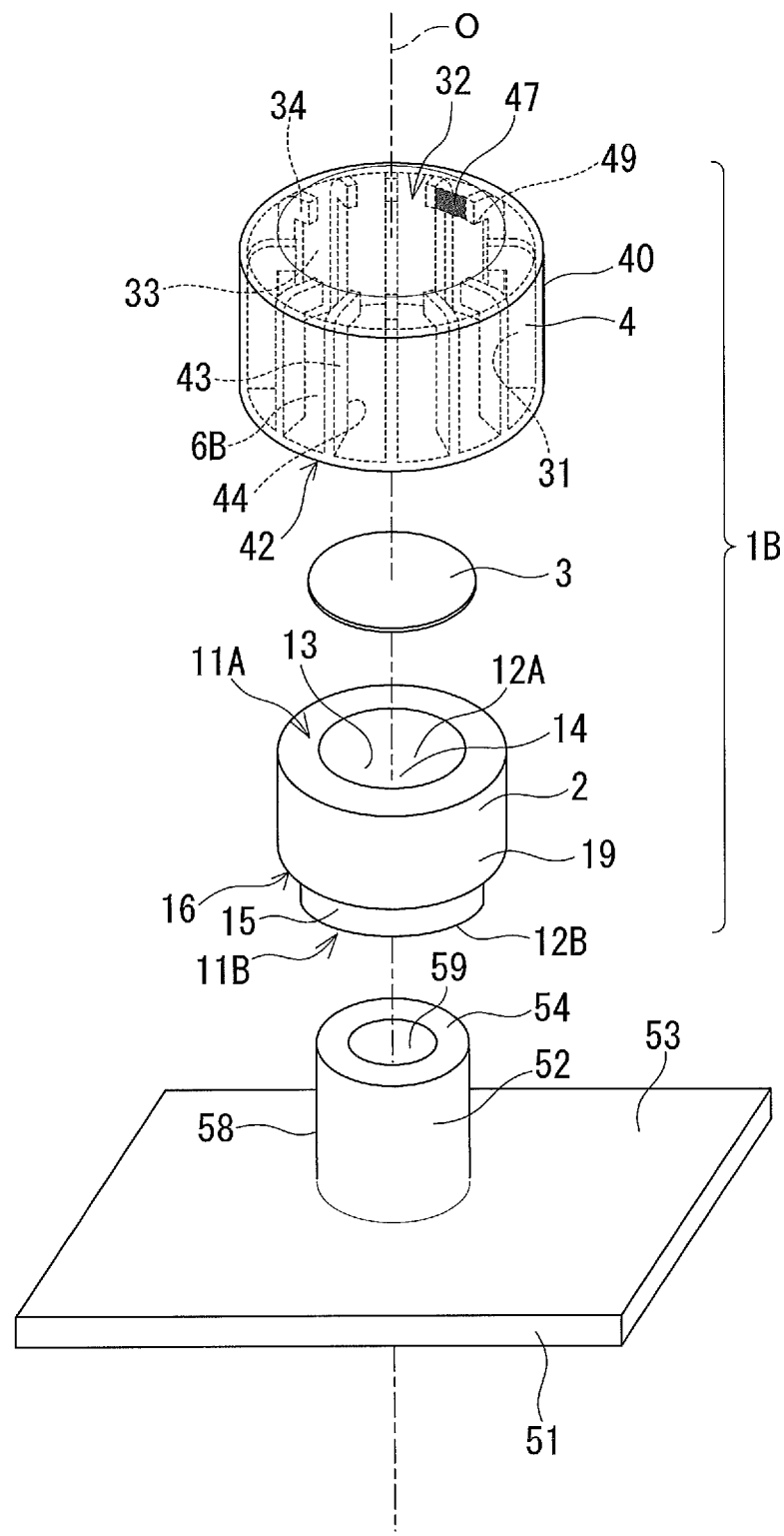
FIG. 4 is an exploded perspective view schematically showing the ventilation assembly of the second embodiment.

FIGS. 3A and 3B show a ventilation assembly 1B of a second embodiment. FIG. 3B shows a cross-section B-B of the ventilation assembly 1B shown in FIG. 3A. FIG. 3A shows a cross-section A-O-A of the ventilation assembly 1B shown in FIG. 3B. FIGS. 3A and 3B show a state where the ventilation assembly 1B is fixed to the projection 52 of the housing 51, in other words, the vicinity of the projection 52 of the housing 51 in a ventilation housing including the ventilation assembly 1B fixed to the projection 52. FIG. 4 shows an exploded perspective view of the ventilation assembly 1B shown in FIGS. 3A and 3B. As shown in FIGS. 3A, 3B, and 4, the ventilation assembly 1B is fixed to the tubular projection 52 extending to project from the outer surface 53 of the housing 51 and internally having the first space 59 communicating the inside and the outside of the housing 51.

The ventilation assembly 1B of the second embodiment is the same as the ventilation assembly 1A of the first embodiment, except that the shape of the external member 4 is different. The description common to the first embodiment is omitted.

The external member 4 of the ventilation assembly 1B is in the shape of a cylinder having a bottom. The external member 4 of the ventilation assembly 1B has two or more third projecting portions 43 projecting from the inner peripheral surface 31 toward the interior of the external member 4 when observed along the central axis O. More specifically, the third projecting portions 43 project toward the central axis O from the inner peripheral surface 31. The third projecting portions 43 extend from the end portion 42 of the external member 4 on the opening side to the bottom portion 32. The direction in which the third projecting portions 43 extend is the direction along the central axis O. The third projecting portions 43 connect to the second projecting portions 34 at the bottom portion 32. However, the direction in which the third projecting portions 43 extend and a zone in which the third projecting portions 43 extend and which is between the end portion 42 and the bottom portion 32 are not limited to those in the above example. The third projecting portions 43 and the second projecting portions 34 may not be connected to each other, and the external member 4 may have the second projecting portions 34 and the third projecting portions 43 independent of each other.

The internal member 2 and the external member 4 in the second embodiment are joined to each other by making the outer peripheral surface 19 of the internal member 2 and front end faces 44 of the third projecting portions 43 of the external member 4 abut each other. In the example shown in FIGS. 3A, 3B, and 4, the front end faces 44 of the third projecting portions 43 coincide with the peripheral surface of a virtual column C having the central axis O as its central axis. Because the material of the internal member 2 is commonly the elastic body, the virtual column C commonly has a diameter equal to or smaller than the diameter of the outer peripheral surface 19. However, the front end faces 44 of the third projecting portions 43 may not coincide with the peripheral surface of the virtual column C as long as the internal member 2 and the external member 4 can be joined together by making the outer peripheral surface 19 and the front end faces 44 abut each other. Gaps 6B between the inner peripheral surface 31 of the external member 4 and the outer peripheral surface 19 of the internal member 2 are each a part of the space 5a. In the example shown in FIGS. 3A, 3B, and 4, the gaps 6B are each surrounded by the inner peripheral surface 31, the outer peripheral surface 19, and the third projecting portions 43.

The external member 4 shown in FIGS. 3A, 3B, and 4 includes twelve third projecting portions 43. The number of third projecting portions 43 in the second embodiment is, for example, six to sixteen.

In the example shown in FIGS. 3A, 3B, and 4, the cross-sections whose areas compose the area $S2_{min}$ are each surrounded by front ends 49 of the adjacent second projecting portions 34 and on the central axis O side, the inner side 33 of the bottom portion 32 of the external member 4, and the end portion 11A of the internal member 2 (refer to the cross-section 47 in FIG. 4). FIG. 4 shows a part (only the cross-section 47 located between a pair of the adjacent second projecting portions 34) of the cross-sections whose areas compose the area $S2_{min}$. Because the cross-sections whose areas compose the area $S2_{min}$ are present between twelve second projecting portions 34, twelve times the area of the cross-section 47 corresponds to the area $S2_{min}$.

In the example shown in FIGS. 3A, 3B, and 4, the cross-sections whose areas compose the area $S2_{out}$ are each surrounded by the inner peripheral surface 31 of the external member 4, the outer peripheral surface 19 of the internal member 2, and the third projecting portions 43 (refer to the cross-section 48 in FIG. 3B). FIG. 3B shows a part (only the cross-section 48 located between a pair of the adjacent third projecting portions 43) of the cross-sections whose areas compose the area $S2_{out}$. Because the cross-sections whose areas compose the area $S2_{out}$ are present between the twelve second projecting portions 34, twelve times the area of the cross-section 48 corresponds to the area $S2_{out}$.

Third Embodiment

Figure 5A:
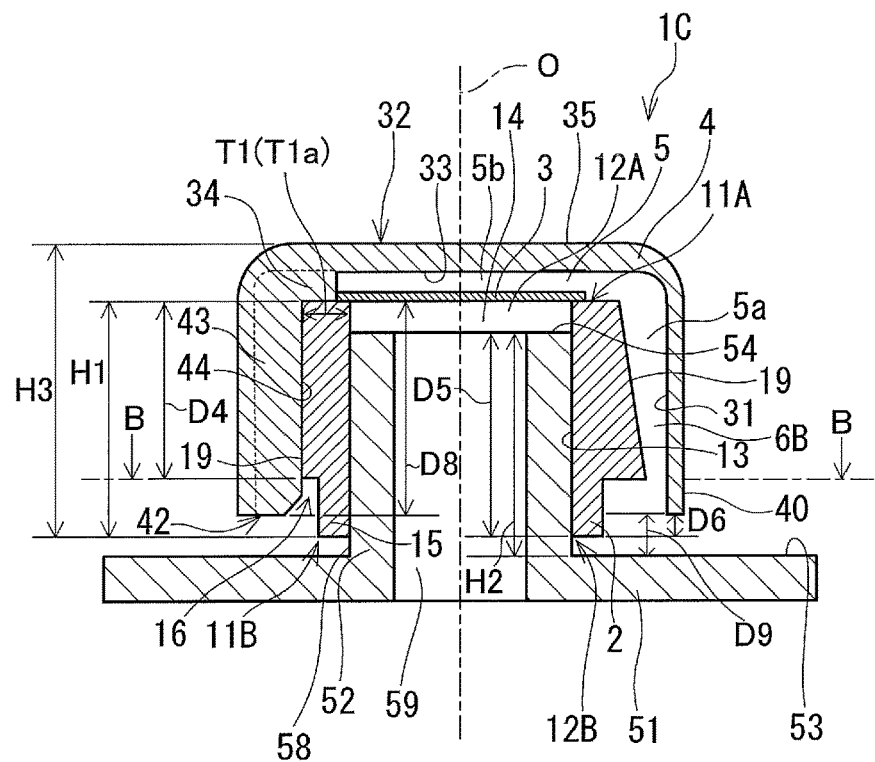
FIG. 5A is a cross-sectional view schematically showing a ventilation assembly of a third embodiment.
Figure 5B:
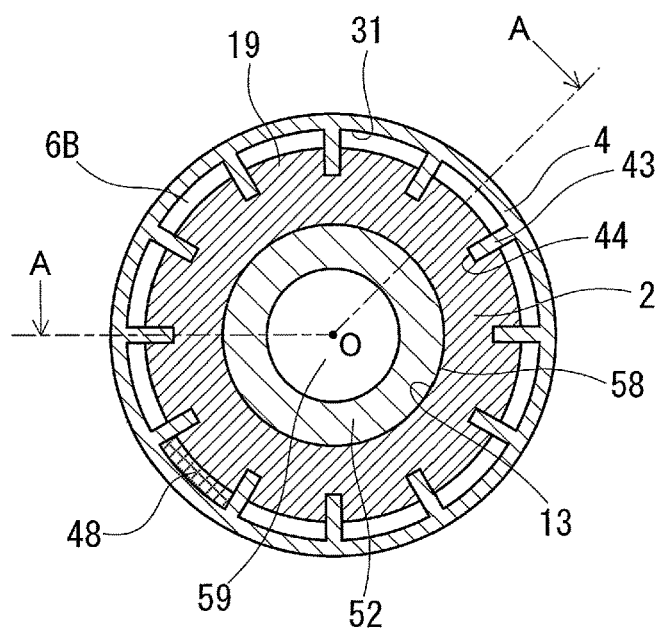
FIG. 5B is a cross-sectional view schematically showing the ventilation assembly of the third embodiment.
Figure 6:
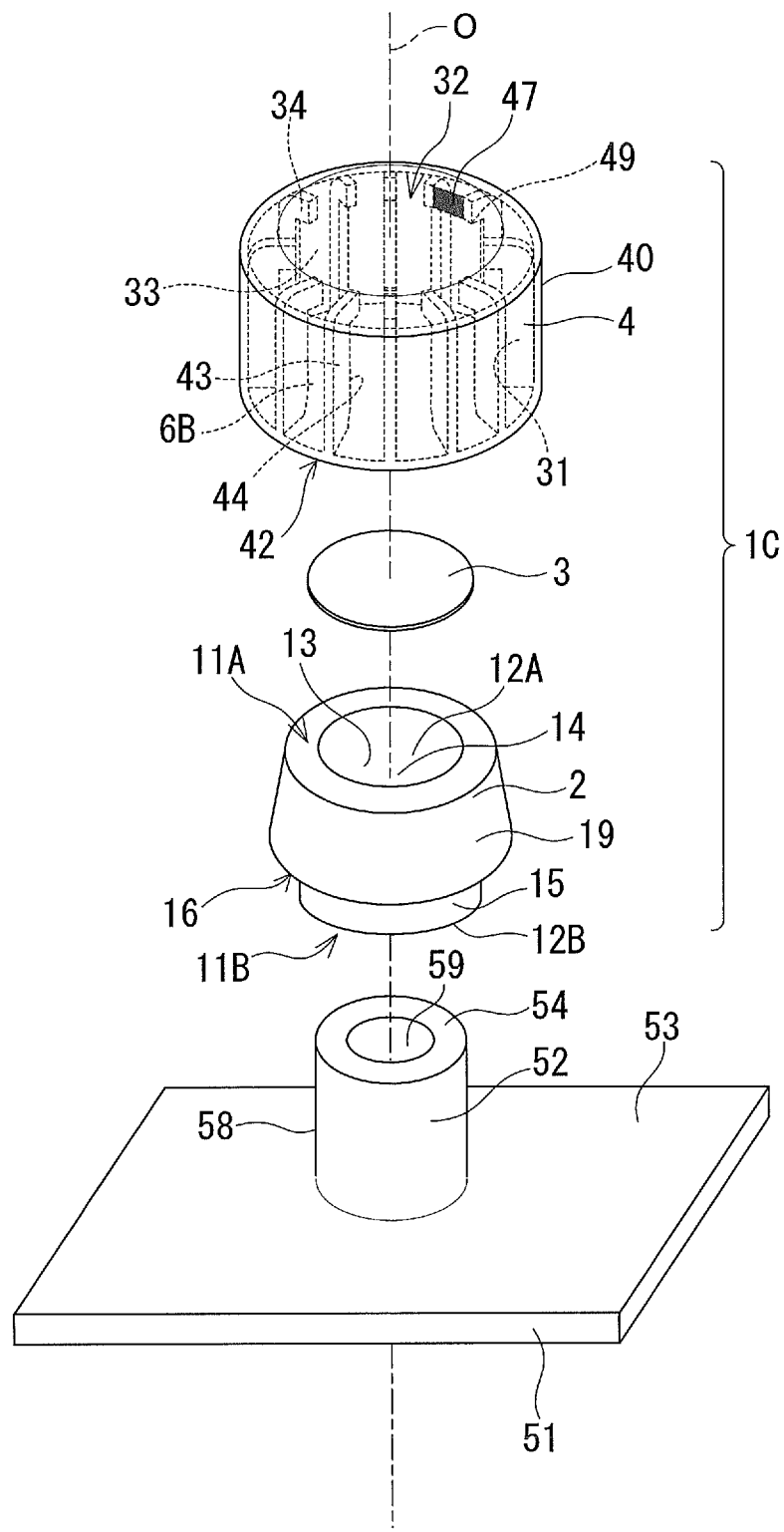
FIG. 6 is an exploded perspective view schematically showing the ventilation assembly of the third embodiment.

FIGS. 5A and 5B show a ventilation assembly 1C of a third embodiment. FIG. 5B shows a cross-section B-B of the ventilation assembly 1C shown in FIG. 5A. FIG. 5A shows a cross-section A-O-A of the ventilation assembly 1C shown in FIG. 5B. FIGS. 5A and 5B show a state where the ventilation assembly 1C is fixed to the projection 52 of the housing 51, in other words, the vicinity of the projection 52 of the housing 51 in a ventilation housing including the ventilation assembly 1C fixed to the projection 52. FIG. 6 shows an exploded perspective view of the ventilation assembly 1C shown in FIGS. 5A and 5B. As shown in FIGS. 5A, 5B, and 6, the ventilation assembly 1C is fixed to the tubular projection 52 extending to project from the outer surface 53 of the housing 51 and internally having the first space 59 communicating the inside and the outside of the housing 51.

The ventilation assembly 1C of the third embodiment is the same as the ventilation assembly 1B of the second embodiment, except that the shape of the internal member 2 is different. The description common to the second embodiment is omitted.

In a state where the external member 4 is not joined, the thickness T1 of the internal member 2 of the ventilation assembly 1C increases from the upper end portion (the end portion 11A) of the internal member 2 toward the lower end portion (the end portion 11B) thereof, more specifically, from the end portion 11A to the step 16 adjacent to the thin portion 15. Thus, the internal member 2 has a slope downwardly spreading out as the outer peripheral surface 19 (refer to FIG. 6). In the example shown in FIG. 6, the thickness T1 continuously increases from the upper end portion of the internal member 2 toward the lower end portion thereof, more specifically, from the end portion 11A to the step 16. The way the thickness T1 increases is not limited to the above example, and the thickness T1, for example, may intermittently increase or may partly decrease. In the example shown in FIG. 6, the outer peripheral surface 19 of the internal member 2 forms the peripheral surface of a circular truncated cone whose diameter increases from the upper end portion toward the lower end portion. In a state where the external member 4 is joined (refer to FIGS. 5A and 5B), each of the third projecting portions 43 of the external member 4 compresses a portion of the outer peripheral surface 19 of the internal member 2 formed of the elastic body, the portion being held against the third projecting portion 43, to bite into the outer peripheral surface 19. The front end face 44 of the third projecting portion 43 sinks deeper into the internal member 2 with respect to the position of the outer peripheral surface 19 in a state where the external member 4 is not joined. At the portion where the outer peripheral surface 19 of the internal member 2 is held against each of the third projecting portions 43, the degree to which the third projecting portion 43 bites into the outer peripheral surface 19 increases from the bottom portion 32 of the external member 4 toward the end portion 42 and from the upper end portion (the end portion 11A) of the internal member 2 toward the lower end portion (the end portion 11B) thereof. A combination of the internal member 2 and external member 4 having the above shapes can increase the rate of downward compression between the internal member 2 and the external member 4 at the portion where the two members abut each other, and that makes it possible to more reliably join the external member 4 to the internal member 2. The combination of the internal member 2 and external member 4 having the above shapes can more reliably prevent dropping of the ventilation assembly 1C from the projection 52 because the direction of the force acting on the internal member 2 by joining the external member 4 thereto is the direction perpendicular to the plane of the slope, more specifically, the direction of pressing the internal member 2 toward the outer surface 53 side of the housing 51.

In the ventilation assembly 1C of the third embodiment, the thickness T1 (T1a) of the internal member 2 at the end portion 11A may be within the above T1 range. In that case, sufficient strength of the internal member 2 can be ensured and, for example, tearing, etc. of the internal member 2 can be reduced at the time of joining the external member 4 to the internal member 2.

Fourth Embodiment

Figure 7A:
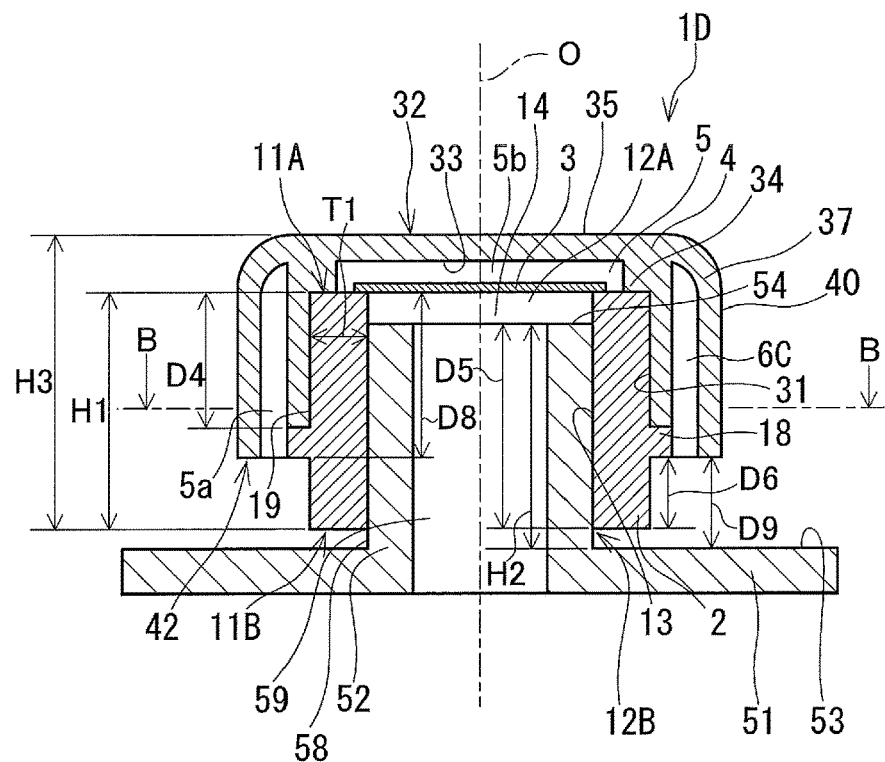
FIG. 7A is a cross-sectional view schematically showing a ventilation assembly of a fourth embodiment.
Figure 7B:
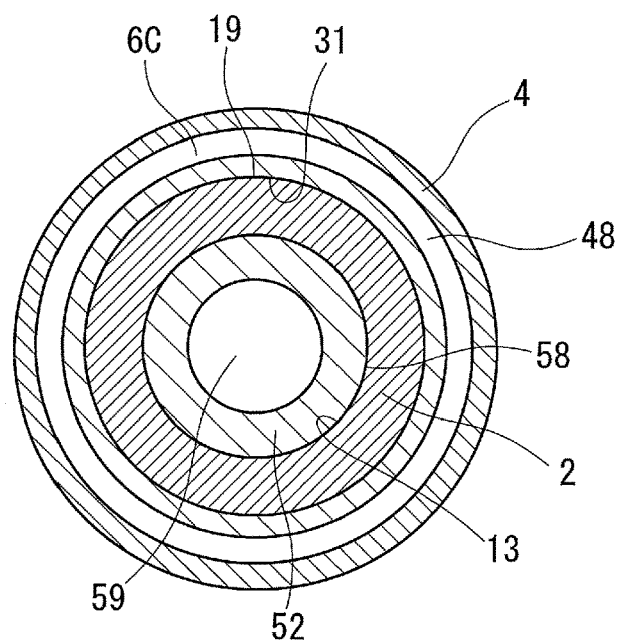
FIG. 7B is a cross-sectional view schematically showing the ventilation assembly of the fourth embodiment.
Figure 8:
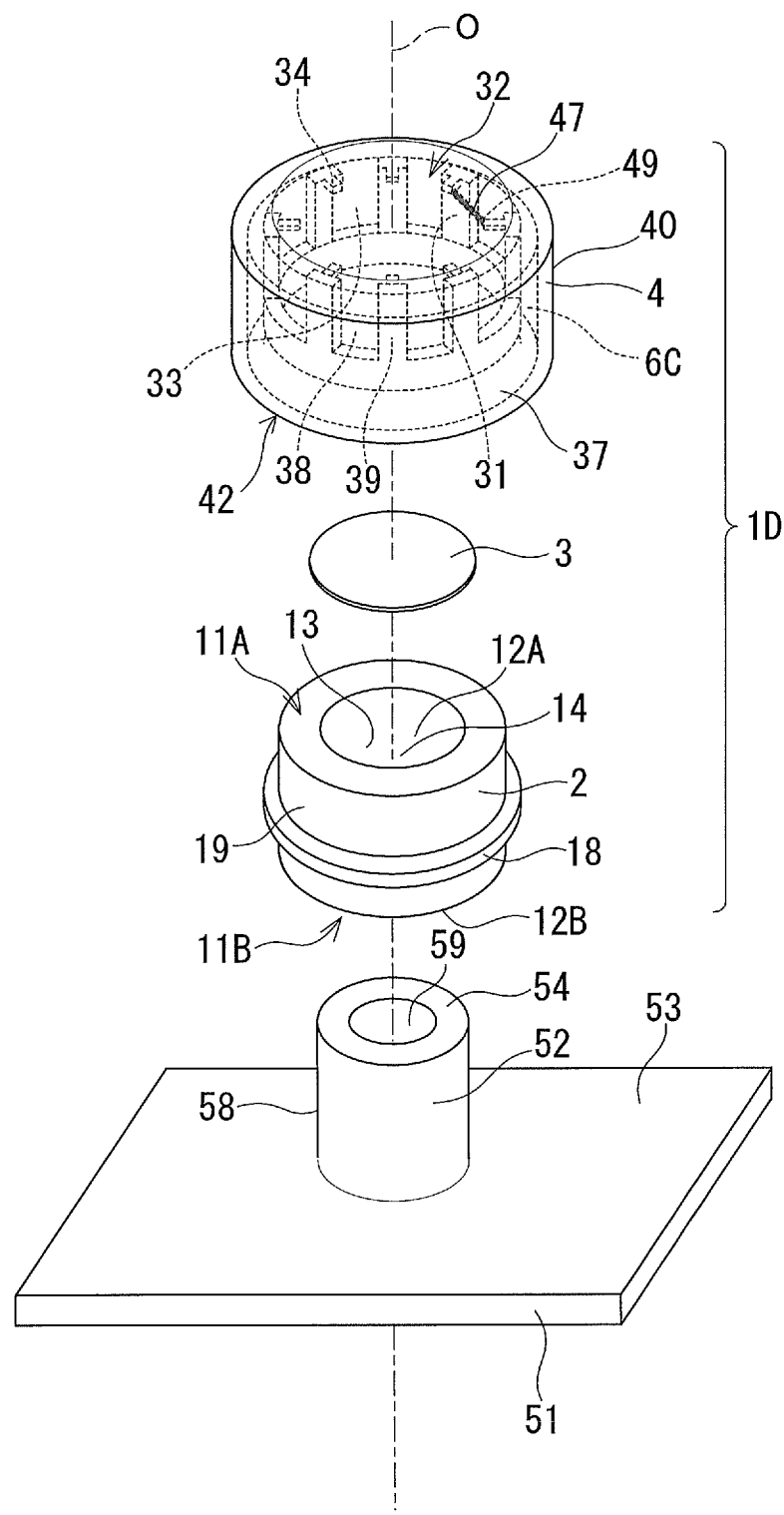
FIG. 8 is an exploded perspective view schematically showing the ventilation assembly of the fourth embodiment.

FIGS. 7A and 7B show a ventilation assembly 1D of a fourth embodiment. FIG. 7B shows a cross-section B-B of the ventilation assembly 1D shown in FIG. 7A. FIGS. 7A and 7B show a state where the ventilation assembly 1D is fixed to the projection 52 of the housing 51, in other words, the vicinity of the projection 52 of the housing 51 in a ventilation housing including the ventilation assembly 1D fixed to the projection 52. FIG. 8 shows an exploded perspective view of the ventilation assembly 1D shown in FIGS. 7A and 7B. As shown in FIGS. 7A, 7B, and 8, the ventilation assembly 1D is fixed to the tubular projection 52 extending to project from the outer surface 53 of the housing 51 and internally having the first space 59 communicating the inside and the outside of the housing 51.

The ventilation assembly 1D of the fourth embodiment is the same as the ventilation assembly 1A of the first embodiment, except that the shapes of the internal member 2 and the external member 4 are different. The description common to the first embodiment is omitted.

The internal member 2 of the ventilation assembly 1D has a rib 18 extending in the peripheral direction on the outer peripheral surface 19. The internal member 2 and the external member 4 are joined together by making the outer peripheral surface 19 of the internal member 2 and the inner peripheral surface 31 of the external member 4 abut each other. Because the material of the internal member 2 is commonly the elastic body, the inner peripheral surface 31 of the external member 4 commonly has a diameter equal to or smaller than the diameter of the outer peripheral surface 19 of the internal member 2. In a state where the internal member 2 and the external member 4 are joined together, the end portion of the external member 4 on the opening side and the rib 18 abut each other.

A gap 6C is provided in the inside of the peripheral wall 37 of the external member 4. The gap 6C is a part of the space 5a.

A portion of the peripheral wall 37 of the external member 4 and on the central axis O side with respect to the gap 6C is divided into a plurality of beam portions 39 by a plurality of slits 38 extending in the direction along the central axis O. Each of the second projecting portions 34 of the external member 4 is connected to the upper end portion of each of the beam portions 39. By virtue of such a shape, the external member 4 and the ventilation assembly 1D can be reduced in weight.

In the example shown in FIGS. 7A, 7B, and 8, the cross-sections whose areas compose the area $S2_{min}$ are each surrounded by front ends 49 of the adjacent second projecting portions 34 and on the central axis O side, the inner side 33 of the bottom portion 32 of the external member 4, and the end portion 11A of the internal member 2 (refer to the cross-section 47 in FIG. 8). FIG. 8 shows a part (only the cross-section 47 located between a pair of the adjacent second projecting portions 34) of the cross-sections whose areas compose the area $S2_{min}$. Because the cross-sections whose areas compose the area $S2_{min}$ are present between eight second projecting portions 34, eight times the area of the cross-section 47 corresponds to the area $S2_{min}$.

In the example shown in FIGS. 7A, 7B, and 8, the cross-section whose area composes the area $S2_{out}$ corresponds to a cross-section of the gap 6C taken along a plane perpendicular to the central axis (refer to the cross-section 48 in FIG. 7B).

Fifth Embodiment

Figure 9A:
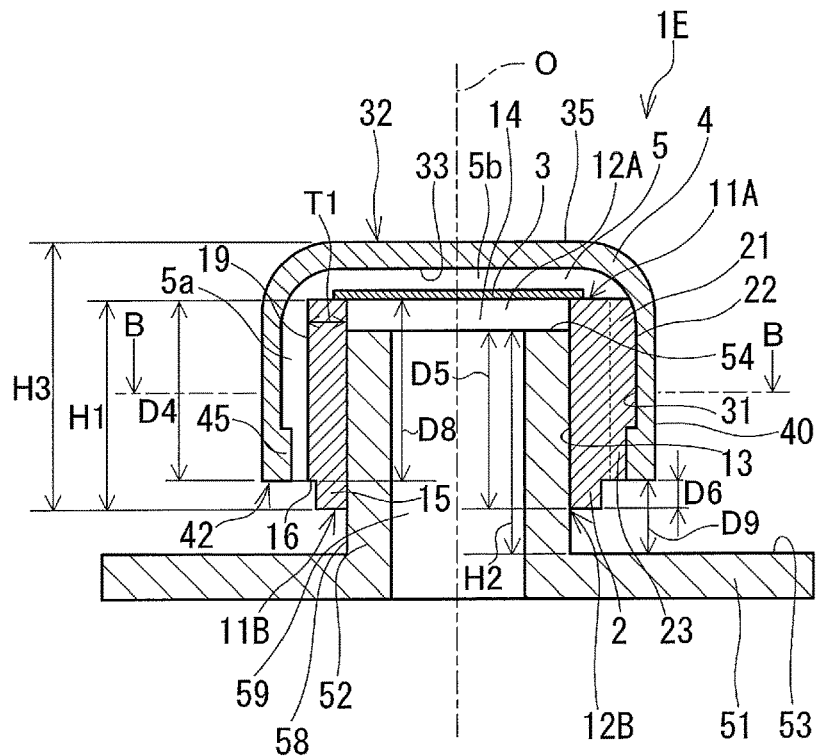
FIG. 9A is a cross-sectional view schematically showing a ventilation assembly of a fifth embodiment.
Figure 9B:
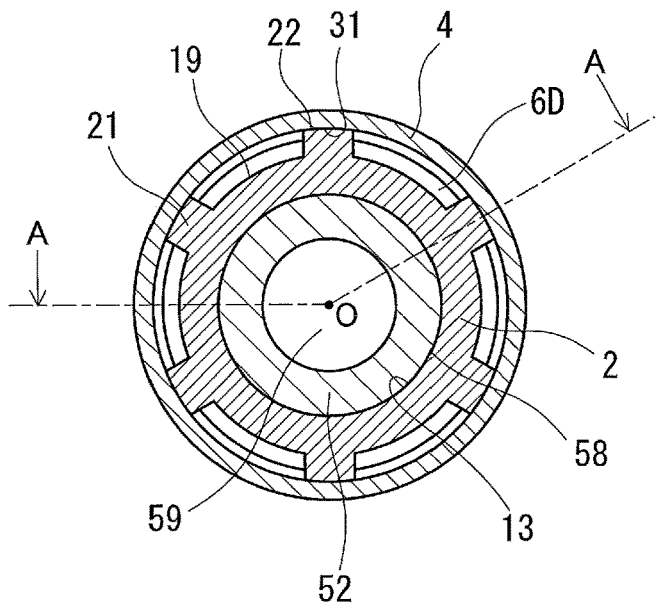
FIG. 9B is a cross-sectional view schematically showing the ventilation assembly of the fifth embodiment.
Figure 10:
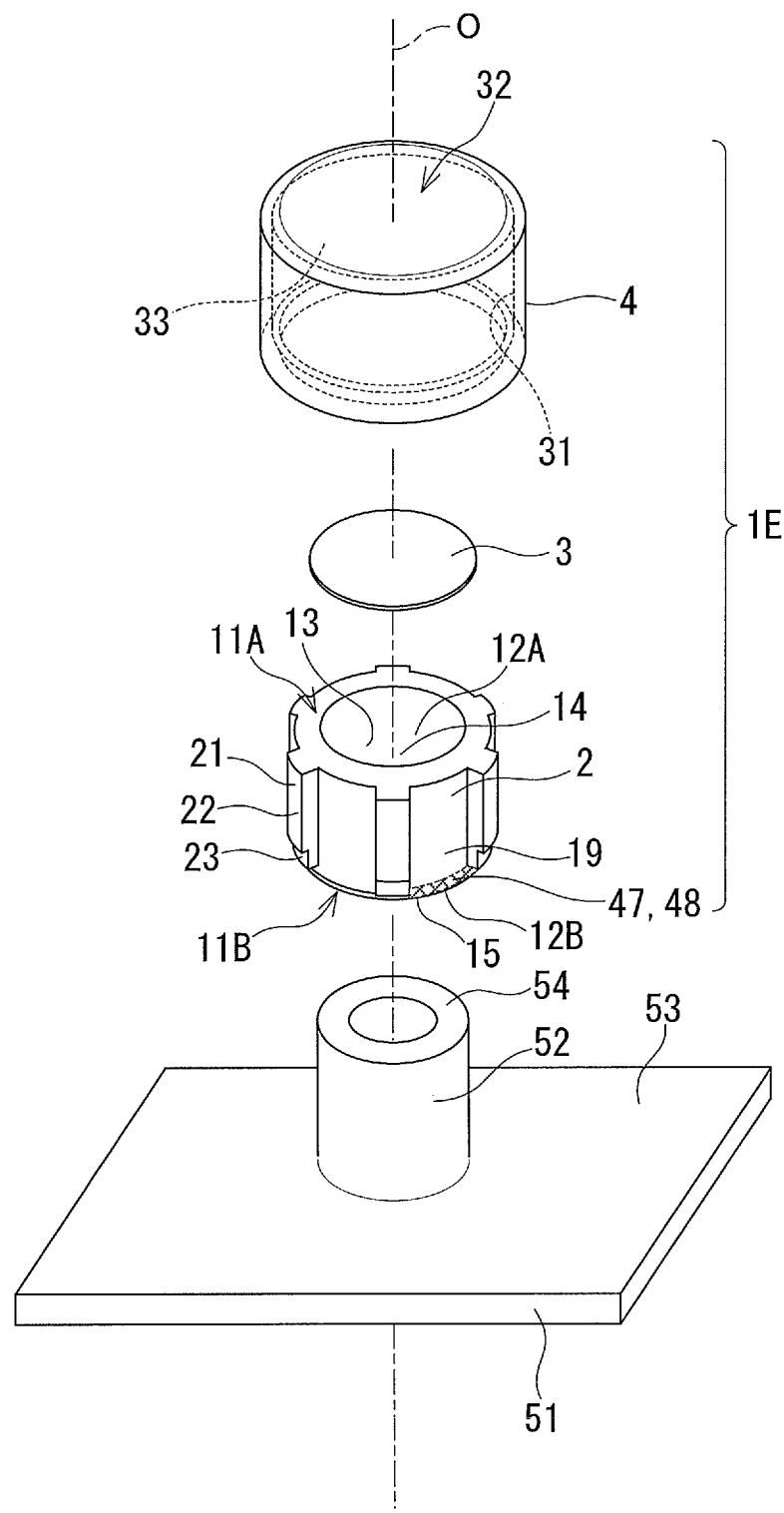
FIG. 10 is an exploded perspective view schematically showing the ventilation assembly of the fifth embodiment.

FIGS. 9A and 9B show a ventilation assembly 1E of a fifth embodiment. FIG. 9B shows a cross-section B-B of the ventilation assembly 1E shown in FIG. 9A. FIGS. 9A and 9B show a state where the ventilation assembly 1E is fixed to the projection 52 of the housing 51, in other words, the vicinity of the projection 52 of the housing 51 in a ventilation housing including the ventilation assembly 1E fixed to the projection 52. FIG. 10 shows an exploded perspective view of the ventilation assembly 1E shown in FIGS. 9A and 9B. As shown in FIGS. 9A, 9B, and 10, the ventilation assembly 1E is fixed to the tubular projection 52 extending to project from the outer surface 53 of the housing 51 and internally having the first space 59 communicating the inside and the outside of the housing 51.

The ventilation assembly 1E of the fifth embodiment is the same as the ventilation assembly 1A of the first embodiment, except that the shapes of the internal member 2 and the external member 4 are different. The description common to the first embodiment is omitted.

The internal member 2 of the ventilation assembly 1E has two or more protruding portions 21 projecting from the outer peripheral surface 19 toward the exterior of the internal member 2 when observed along the central axis O of the ventilation assembly 1E. The protruding portions 21 are provided at regular intervals in the peripheral direction of the outer peripheral surface 19. Each of the protruding portions 21 extends in the direction along the central axis O from the one end portion 11A of the internal member 2 to the step 16. However, a zone in which the protruding portions 21 extend in the direction along the central axis O and which is between the one end portion 11A to the other end portion 11B of the internal member 2 is not limited to the above example. In the example shown in FIGS. 9A, 9B, and 10, each of the protruding portions 21 has, on the other end portion 11B side, a portion 23 where the amount of projection from the outer peripheral surface 19 is small.

The internal member 2 and the external member 4 in the fifth embodiment are joined to each other by making peripheral surfaces 22 of the protruding portions 21 of the internal member 2 and the inner peripheral surface 31 of the external member 4 abut each other. In the example shown in FIGS. 9A, 9B, and 10, the peripheral surfaces 22 coincide with the peripheral surface of a virtual column D having the central axis O as its central axis. Because the material of the internal member 2 is commonly the elastic body, the virtual column D commonly has a diameter equal to or larger than the diameter of the inner peripheral surface 31. However, the peripheral surfaces 22 of the protruding portions 21 may not coincide with the peripheral surface of the virtual column D as long as the internal member 2 and the external member 4 can be joined together by making the peripheral surfaces 22 and the inner peripheral surface 31 abut each other. Gaps 6D between the inner peripheral surface 31 of the external member 4 and the outer peripheral surface 19 of the internal member 2 are each a part of the space 5a. In the example shown in FIGS. 9A, 9B, and 10, the gaps 6D are each surrounded by the inner peripheral surface 31, the outer peripheral surface 19, and the protruding portions 21.

The internal member 2 shown in FIGS. 9A, 9B, and 10 has six protruding portions 21. The number of the protruding portions 21 in the fifth embodiment is, for example, three to eight.

In the example shown in FIGS. 9A, 9B, and 10, the cross-sections whose areas compose the area $S2_{min}$ are each surrounded by the inner peripheral surface 31 of the external member 4, the outer peripheral surface 19 of the internal member 2, and the protruding portions 21 (refer to the cross-section 47 in FIG. 10). FIG. 10 shows a part (only the cross-section 47 located between a pair of the adjacent protruding portions 21) of the cross-sections whose areas compose the area $S2_{min}$. Because the cross-sections whose areas compose the area $S2_{min}$ are present between six protruding portions 21, six times the area of the cross-section 47 corresponds to the area $S2_{min}$.

In the example shown in FIGS. 9A, 9B, and 10, the cross-sections whose areas compose the area $S2_{out}$ are each surrounded by the inner peripheral surface 31 of the external member 4 at the end portion 42 of the external member 4 on the opening side, the outer peripheral surface 19 of the internal member 2, and the protruding portions 21 (refer to the cross-section 48 in FIG. 10). FIG. 10 shows a part (only the cross-section 48 located between a pair of the adjacent protruding portions 21) of the cross-sections whose areas compose the area $S2_{out}$. Because the cross-sections whose areas compose the area $S2_{out}$ are present between the six protruding portions 21, six times the area of the cross-section 48 corresponds to the area $S2_{out}$.

In the example shown in FIGS. 9A, 9B, and 10, the external member 4 has claws 45 projecting toward the interior of the external member 4, more specifically, toward the central axis O, at the ends on the end portion 42 side on the opening side. In a state where the internal member 2 and the external member 4 are joined together, the claw 45 is locked to the portion 23 of the internal member 2 and functions as a locking mechanism detachably joining the internal member 2 and the external member 4 together. The internal member 2 and the external member 4 can be more reliably joined together by the locking mechanism, more specifically, by locking the claw 45 to the portion 23. For example, dropping of the external member 4 from the internal member 2 can be prevented at the time of fixation of the ventilation assembly 1E to the projection 52 of the housing 51.

EXAMPLES

Moisture Permeation Test 1 of Ventilation Housing

Example 1

Figure 11A:
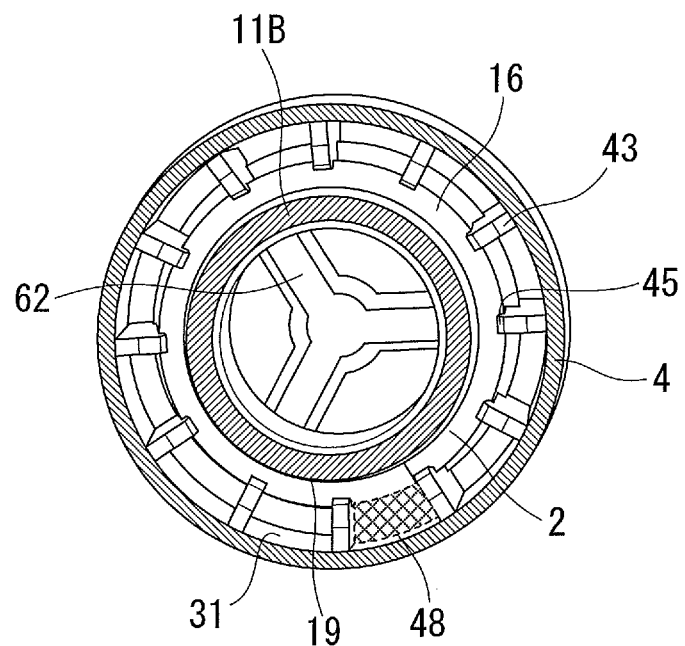
FIG. 11A is a perspective view of a ventilation assembly produced in EXAMPLES.

An internal member 2 having the shape shown in FIG. 11A was produced by injection molding using an olefin-based thermoplastic elastomer (MILASTOMER (registered trademark) manufactured by Mitsui Chemicals, Inc.; hardness: 71; density: 880 kg/m³) as a material. The obtained internal member 2 had a maximum thickness of 2.4 mm, a minimum thickness of 1.1 mm, an outer diameter of 12 mm at a portion having the maximum thickness, an outer diameter of 10 mm at a portion having the minimum thickness, an inner diameter of 7.5 mm, and a height H1 of 8.0 mm. The internal member 2 of FIG. 11A had the same shape as that of the internal member 2 of FIGS. 3A, 3B, and 4, except for having a projecting portion (a bridge) 62 projecting into the internal space of the internal member 2 at the end portion 11A.

Figure 11B:
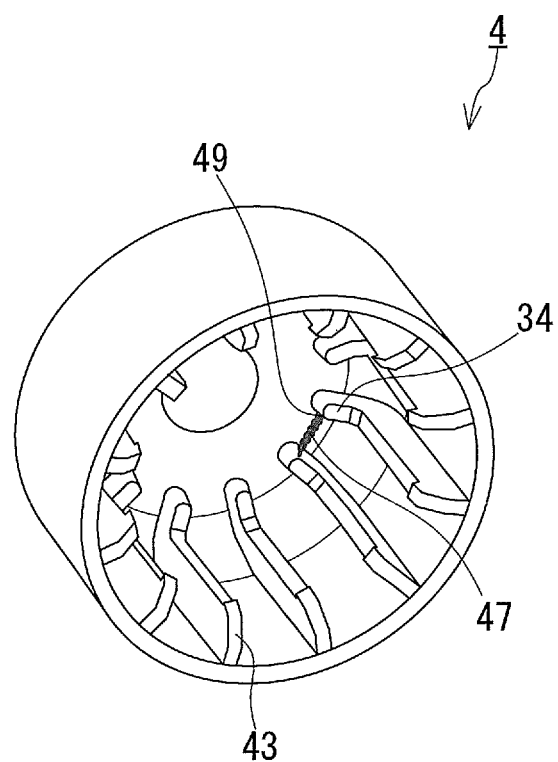
FIG. 11B is a perspective view schematically showing an external member included in the ventilation assembly of FIG. 11A.

An external member 4 having the shape shown in FIGS. 11A and 11B was produced by injection molding using polypropylene (manufactured by Japan Polypropylene Corporation) as a material. The obtained external member 4 had a maximum thickness of 2.5 mm, a minimum thickness of 0.6 mm, an outer diameter of 16 mm, an inner diameter of 11.1 mm at a portion having the maximum thickness, an inner diameter of 13.3 mm at a portion having the minimum thickness, and a height of 9.0 mm. The external member 4 of FIGS. 11A and 11B had the same shape as that of the external member 4 of FIGS. 3A, 3B, and 4, except for having the claw 45 projecting toward the central axis O at the end of the third projecting portion 43 and on the end portion 42 side. In FIGS. 11A and 11B, the internal member 2 and the external member 4 are viewed from the bottom (the opening side of the external member 4).

Next, a laminate (TEMISH "NTF1026-L01" manufactured by Nitto Denko Corporation; gas permeation amount: 50 cm³/min) of a stretched porous PTFE membrane and a non-woven fabric made of PE/PET composite fibers was used as a material and was punched to give a 12-mm-diameter circular piece. A gas-permeable membrane 3 was thus produced. Then, the gas-permeable membrane 3 was disposed so as to completely cover the through hole 14 of the internal member 2. The gas-permeable membrane 3 was welded to the internal member 2 by compression bonding and heating at a temperature of 200° C. and a pressure of 20 N for 2 seconds. Then, the internal member 2 to which the gas-permeable membrane 3 was welded was press-fitted (inserted) into the external member 4 to obtain a ventilation assembly.

Figure 12A:
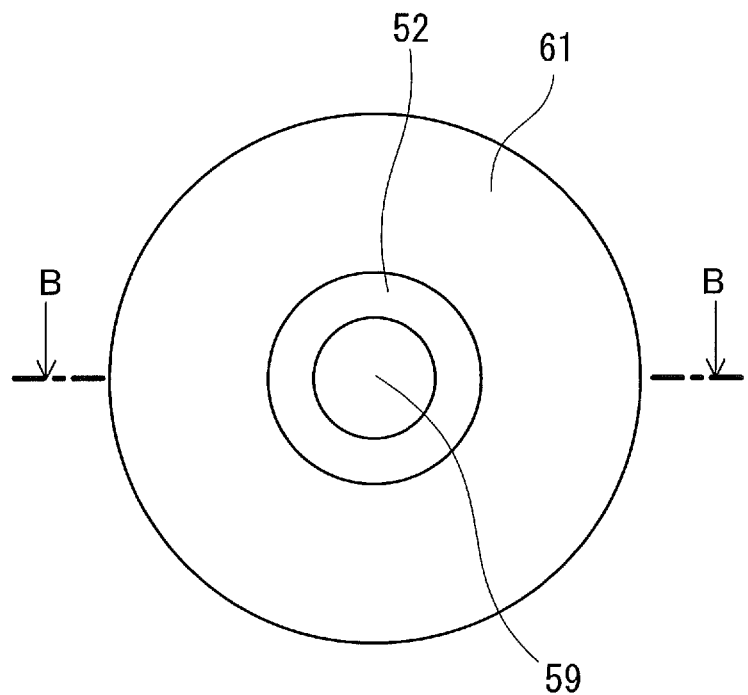
FIG. 12A is a plan view schematically showing a housing lid used to evaluate the moisture permeation performance (moisture permeation rate) of a ventilation housing.
Figure 12B:
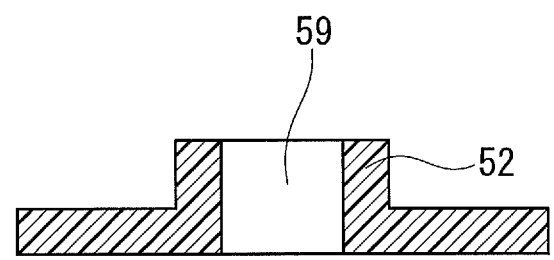
FIG. 12B is a schematic view showing a cross-section of the housing lid of FIG. 12A.

A housing lid 61 shown in FIGS. 12A and 12B and including the tubular projection 52 internally having the first space 59 was produced using a hard resin "Vero Black Plus (RGD875)" as a material and a 3D printer (Objet30 Prime). FIG. 12B shows a cross-section B-B shown in FIG. 12A. The projection 52 had an outer diameter of 8.5 mm, an inner diameter of 5.0 mm, and a height H2 of 6.0 mm. Next, the projection 52 of the housing lid 61 was inserted (inserted until the end portion of the internal member 2 on the lower side came into contact with the housing 61) in the opening (the opening at the end portion on the lower side) of the internal member 2 of the ventilation assembly to prepare a ventilation assembly-attached housing lid including the ventilation assembly fixed to the projection 52.

An amount of 42 g of water was held in a moisture permeation cup (having a 60-mm-diameter opening and an inner diameter of 60 mm as specified in Japanese Industrial Standards (JIS) L 1099 A-2 (water method)) having been left to stand in a thermo-hygrostat at a humidity of 50% and a temperature of 40° C. The ventilation assembly-attached housing lid was disposed on and attached to the opening portion of the cup in such a manner that the entire opening face of the cup was completely covered. The projection 52 and the ventilation assembly were exposed to the outside of the cup. In the attached state, the interval between the water surface and the lower surface of the housing lid 61 was 10 mm and the moisture permeation area of the ventilation assembly was 44 mm². Then, the cup was left to stand in the above thermo-hygrostat for 1 hour. After that, the cup was taken out of the thermo-hygrostat and, together with the ventilation assembly-attached housing lid, measured for a mass W1 (g). Subsequently, after left to stand in the above thermo-hygrostat for 24 hours, the cup was taken out again and, together with the ventilation assembly-attached housing lid, measured for a mass W2 (g). The difference between the masses measured for the cup before and after the cup was left to stand in the thermo-hygrostat for the second time was defined as A (g) (=W1−W2), and the area of the opening face of the cup was defined as B (m²). The moisture permeation rate was calculated by the following equation (1) as the moisture permeation performance of the ventilation housing.

$$\text{Moisture permeation rate } [gm^{-2}h^{-1}] = A/B/24 \quad (1)$$

Table 1 shows the result of measuring the moisture permeation rate. The term "insertion depth of external member" in Table 1 refers to the central axial length of a portion of the internal member, the portion being covered by the external member when observed in the direction perpendicular to the central axis of the ventilation assembly. The term "inside-outside contact length" refers to the central axial length of a portion where the external member and the internal member are in contact with each other when observed in the direction perpendicular to the central axis of the ventilation assembly. The term "ventilation distance" refers to the distance determined by adding the insertion depth of the external member and a greater height selected from the height H1 of the internal member and the height H2 of the projection. The "ventilation distance" substantially corresponds to the distance from the inside of the housing to an exit of the ventilation assembly.

Examples 2 to 4 and Comparative Examples 1 to 6

The moisture permeation test was performed in the same manner as in Example 1, except that the height H1 of the internal member 2, the height H2 of the projection 52, the gas permeation amount of the gas-permeable membrane 3, the height of the external member 4, the insertion depth of the external member 4, and the inside-outside contact length were changed to the values shown in Table 1. Table 1 shows the results of measuring the moisture permeation rate.

Comparative Examples 7 to 9

Figure 13A:
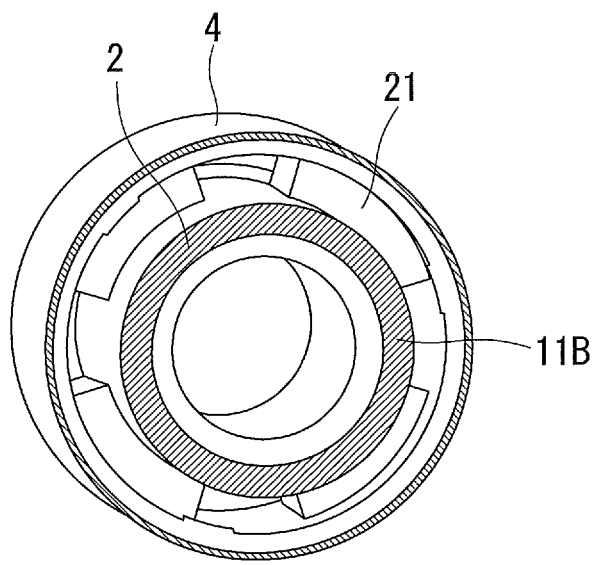
FIG. 13A is a perspective view of a ventilation assembly produced in EXAMPLES.
Figure 13B:
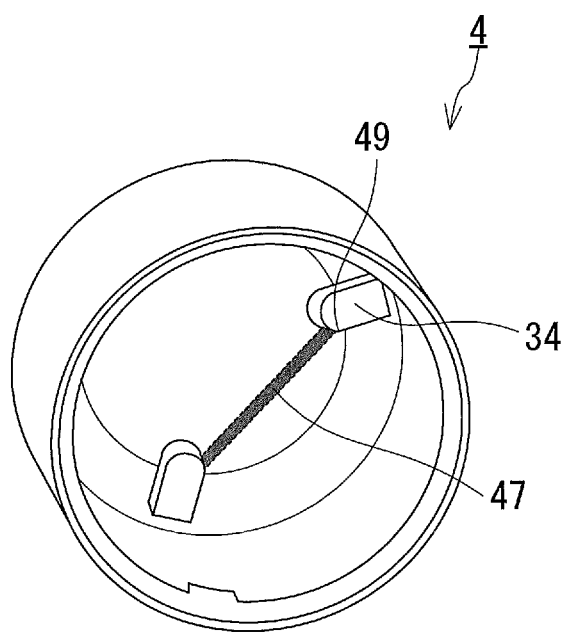
FIG. 13B is a perspective view schematically showing an external member included in the ventilation assembly of FIG. 13A.

The moisture permeation test was performed in the same manner as in Example 1, except that the shapes of the internal member 2 and the external member 4 were changed to those shown in FIGS. 13A and 13B. Table 1 shows the result of measuring the moisture permeation rate. In Comparative Examples 7 to 9, the height H1 of the internal member 2, the height H2 of the projection 52, the gas permeation amount of the gas-permeable membrane 3, the height of the external member 4, the insertion depth of the external member 4, and the inside-outside contact length are as shown in Table 1. The internal member 2 of FIG. 13A had the same shape as that of the internal member 2 of FIGS. 9A, 9B, and 10, except that the number of the protruding portions 21 is four. The external member 4 of FIGS. 13A and 13B had the same shape as that of the external member 4 of FIGS. 9A, 9B, and 10, except that the external member 4 of FIGS. 13A and 13B had no claw 45, that the end portion 42 on the opening side was located lower than the step 16 when viewed in the direction perpendicular to the central axis of the ventilation assembly, and that the external member 4 of FIGS. 13A and 13B had three second projecting portions 34 projecting to extend from the inner peripheral surface 31 toward the central axis on the inner side 33 of the bottom portion 32. In FIGS. 13A and 13B, the internal member 2 and the external member 4 are viewed from the bottom.

TABLE 1

|  | Height H1 of internal member [mm] | Height H2 of tubular projection [mm] | Ratio H1/H2 | Gas permeation amount of gas-permeable membrane [cm³/min] | Height of external member [mm] | Insertion depth of external member [mm] | Inside-outside contact length [mm] | Ventilation distance [mm] | Moisture permeation rate [gm⁻²h⁻¹] |
|---|---|---|---|---|---|---|---|---|---|
| Example 1 | 8 | 6 | 1.33 | 50 | 9 | 7 | 5.5 | 15 | 64.3 |
| Example 2 |  | 8 | 1.00 |  |  |  |  | 15 | 60.6 |
| Comparative Example 1 |  | 10 | 0.80 |  | 5 | 3 | 3 | 13 | 69.1 |
| Comparative Example 2 |  |  | 0.80 |  | 7 | 5 | 5 | 15 | 66.7 |
| Comparative Example 3 |  |  | 0.80 |  | 9 | 7 | 5.5 | 17 | 55.6 |
| Comparative Example 4 |  | 15 | 0.53 |  |  |  |  | 22 | 41.4 |
| Comparative Example 5 |  | 20 | 0.40 |  |  |  |  | 27 | 34.7 |
| Example 3 |  | 6 | 1.33 | 13000 |  |  |  | 15 | 72.2 |
| Example 4 |  | 8 | 1.00 |  |  |  |  | 15 | 59.4 |
| Comparative Example 6 |  | 10 | 0.80 |  |  |  |  | 17 | 57.5 |
| Comparative Example 7 | 12 | 10 | 1.20 | 50 | 12 | 10 | 5.05 | 22 | 49.6 |
| Comparative Example 8 |  | 15 | 0.80 |  |  |  |  | 25 | 40.0 |
| Comparative Example 9 |  | 20 | 0.60 |  |  |  |  | 30 | 32.3 |

Figure 14:
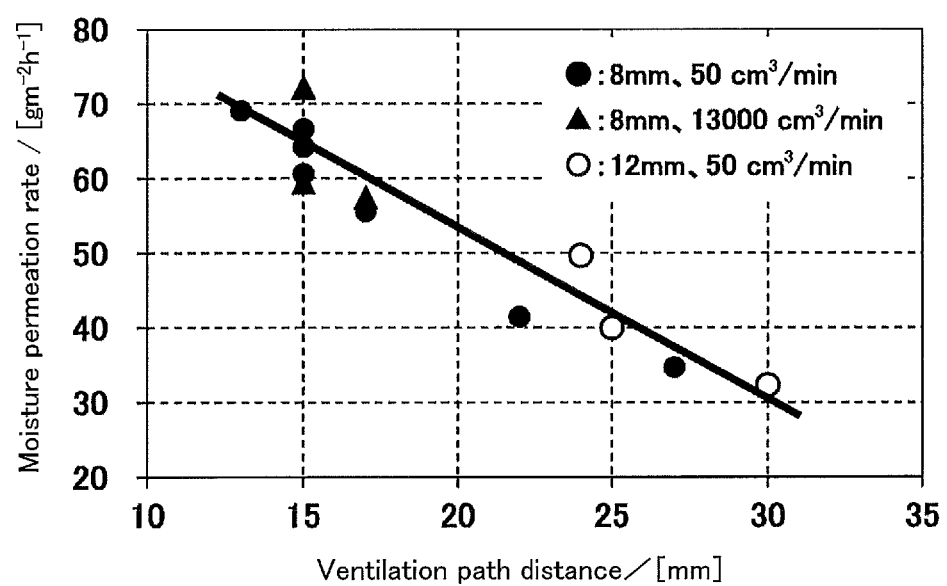
FIG. 14 is a graph on which a relation between moisture permeation rates and ventilation distances is plotted for Examples 1 to 4 and Comparative Examples 1 to 9.

For Examples 1 to 4 and Comparative Examples 1 to 9, FIG. 14 shows a graph on which a relation between the moisture permeation rates and the ventilation distances is plotted. In the graph, Examples 1 and 2 and Comparative Examples 1 to 5 in which the height H1 of the internal member was 8.0 mm and the gas permeation amount of the gas-permeable membrane was 50 cm$^3$/min are plotted as black circles (●). Examples 3 and 4 and Comparative Example 6 in which the height H1 of the internal member was 8.0 mm and the gas permeation amount of the gas-permeable membrane was 13000 cm$^3$/min is plotted as a black triangle (▲). Comparative Examples 7 to 9 in which the height H1 of the internal member was 12 mm and the gas permeation amount of the gas-permeable membrane was 50 cm$^3$/min is plotted as a circle (○). As shown in FIG. 14, the approximately 260-fold difference between the gas permeation amounts of the gas-permeable membranes of each of Examples 1 and 2 and Comparative Examples 1 to 5 and each of Examples 3 and 4 and Comparative Example 6 does not cause a great difference in the moisture permeation rate, compared to the difference between the ventilation distances thereof. This clearly indicates a great dependence of the moisture permeation rate on the ventilation distance. Additionally, for the ventilation housings (Comparative Examples 7 to 9) in which the height H1 of the internal member is 12 mm, the moisture permeation rates tend to be low on the whole due to the relatively long ventilation distances. On the other hand, for the ventilation housings (Examples 1 to 4 and Comparative Examples 1 to 6) in which the height H1 of the internal member is 8.0 mm, the moisture permeation rates tend to be high on the whole. It has been confirmed that when the projection having a greater height than the height H1 of the internal member is inserted, that is, when the ratio H1/H2 of the height H1 of the internal member to the height H2 of the projection is less than 1.00, even the ventilation housings in which the height H1 of the internal member is 10 mm or less have long ventilation distances and thus have low moisture permeation rates.

<Moisture Permeation Test 2 of Ventilation Housing>
[Preparation of Ventilation Assembly]

A ventilation assembly A in which the height H1 of the internal member was 8.0 mm, the height of the external member was 9.0 mm, and the insertion depth of the external member was 7.0 mm was obtained in the same manner as in Example 1.

A ventilation assembly B was obtained in the same manner as in Example 1, except that the shapes of the internal member 2 and the external member 4 were changed to those shown in FIGS. 13A and 13B.

Figure 15A:
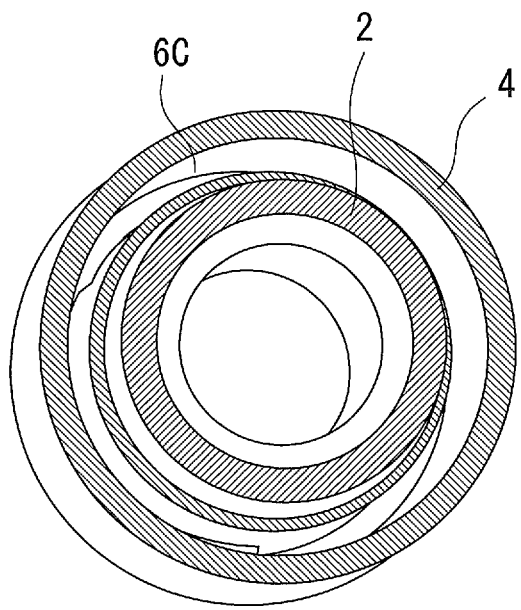
FIG. 15A is a perspective view of a ventilation assembly produced in EXAMPLES.
Figure 15B:
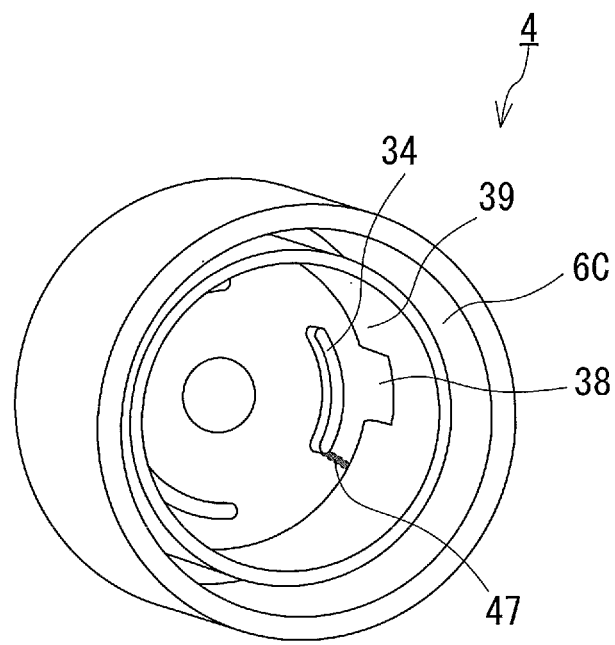
FIG. 15B is a perspective view schematically showing an external member included in the ventilation assembly of FIG. 15A.

A ventilation assembly C was obtained in the same manner as in Example 1, except that the shapes of the internal member 2 and the external member 4 were changed to those shown in FIGS. 15A and 15B. The internal member 2 of FIG. 15A had the same shape as that of the internal member 2 of FIGS. 7A, 7B, and 8, except for having no rib 18. The external member 4 of FIGS. 15A and 15B had the same shape as that of the external member 4 of FIGS. 7A, 7B, and 8, except that the positions and shapes of the second projecting portions 34 were different. The gap 6C which is a part of the space 5a was provided in the inside of the peripheral wall of the external member 4. In FIGS. 15A and 15B, the internal member 2 and the external member 4 are viewed from the bottom.

Figure 16A:
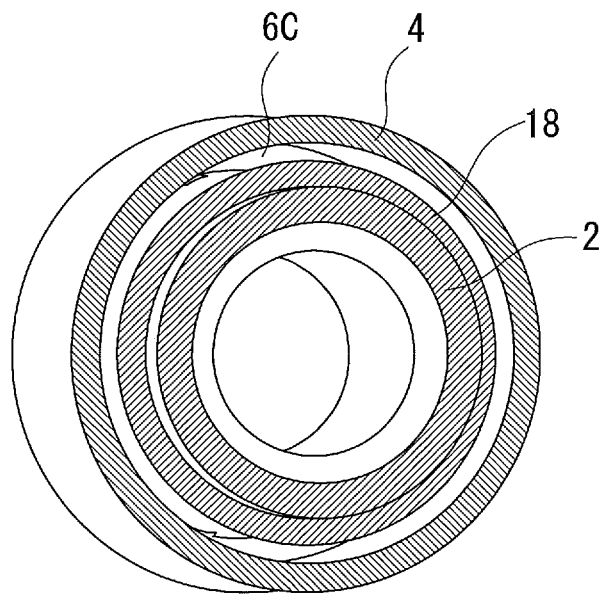
FIG. 16A is a perspective view of a ventilation assembly produced in EXAMPLES.
Figure 16B:
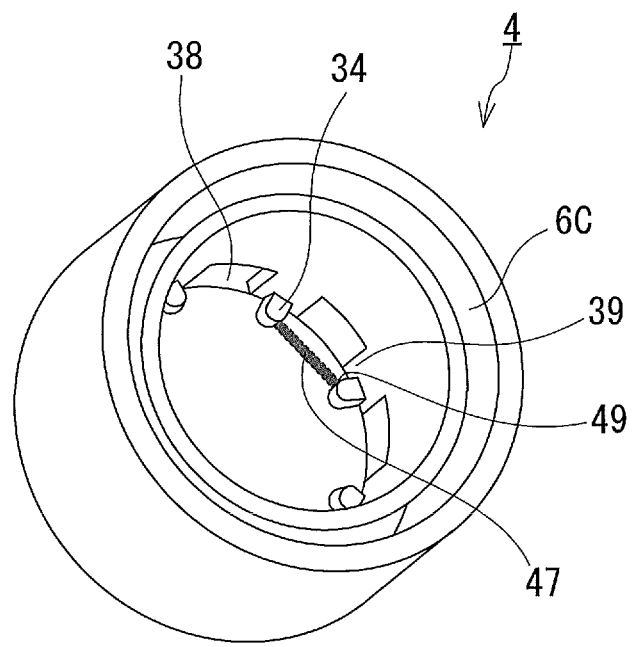
FIG. 16B is a perspective view schematically showing an external member included in the ventilation assembly of FIG. 16A.

A ventilation assembly D was obtained in the same manner as in Example 1, except that the shapes of the internal member 2 and the external member 4 were changed to those shown in FIGS. 16A and 16B. The internal member 2 of FIG. 16A had the same shape as that of the internal member 2 of FIGS. 7A, 7B, and 8. The external member 4 of FIGS. 16A and 16B had the same shape as that of the external member 4 of FIGS. 7A, 7B, and 8. In FIGS. 16A and 16B, the internal member 2 and the external member 4 are viewed from the bottom.

Figure 17A:
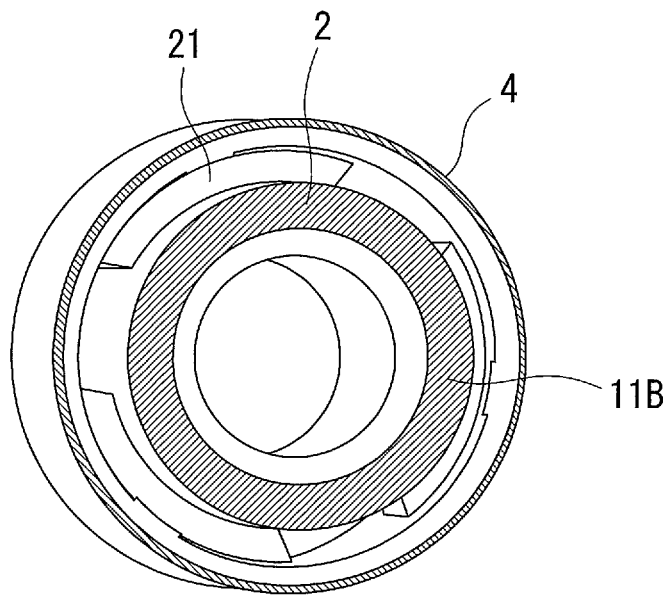
FIG. 17A is a perspective view of a ventilation assembly produced in EXAMPLES.
Figure 17B:
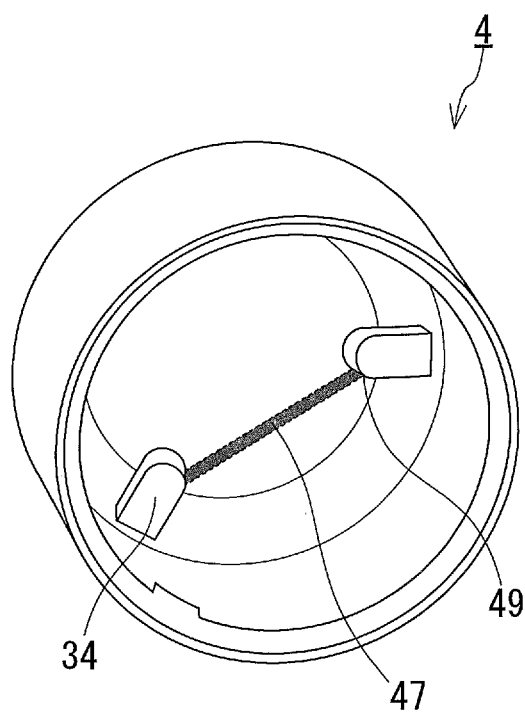
FIG. 17B is a perspective view schematically showing an external member included in the ventilation assembly of FIG. 17A.

A ventilation assembly E was obtained in the same manner as in Example 1, except that the shapes of the internal member 2 and the external member 4 were changed to those shown in FIGS. 17A and 17B. The internal member 2 of FIG. 17A had the same shape as that of the internal member 2 of FIGS. 9A, 9B, and 10, except that the number of the protruding portions 21 was three. The external member 4 of FIGS. 17A and 17B had the same shape as that of the external member 4 of FIGS. 9A, 9B, and 10, except that the external member 4 of FIGS. 17A and 17B had no claw 45, that the end portion 42 on the opening side was located lower than the step 16 when viewed in the direction perpendicular to the central axis of the ventilation assembly, and that the external member 4 of FIGS. 17A and 17B had three second projecting portions 34 projecting to extend from the inner peripheral surface 31 toward the central axis on the inner side 33 of the bottom portion 32. In FIGS. 17A and 17B, the internal member 2 and the external member 4 are viewed from the bottom.

In the ventilation assemblies B to E, the height H1 of the internal member, the height of the external member, and the insertion depth of the external member were the same as those in the ventilation assembly A.

The ventilation assemblies were each measured for the area $S2_{min}$ of cross-sections having the smallest areas, the cross-sections of the second space each taken along a plane perpendicular to the ventilation direction in the ventilation path. For the cross-sections having the smallest areas, the cross-section 47 shown in some figures can be referred to. The figures show a part of the cross-sections having the smallest areas, which is the smallest unit of the cross-sections having the smallest areas, as the cross-section 47. For the ventilation assemblies, the area $S2_{min}$ of the cross-sections having the smallest areas was twelve times (ventilation assembly A), three times (ventilation assembly B), six times (ventilation assembly C), and eight times (ventilation assembly D) the area of the cross-section 47. The measurement operation was specifically as follows. It should be noted that the area $S2_{min}$ of the ventilation assembly E was the area $S2_{out}$ to be described. The total area of cross-sections each taken at a position where the total area is the second smallest to the area $S2_{out}$ is three times the area of the cross-section 47.

Figure 18:
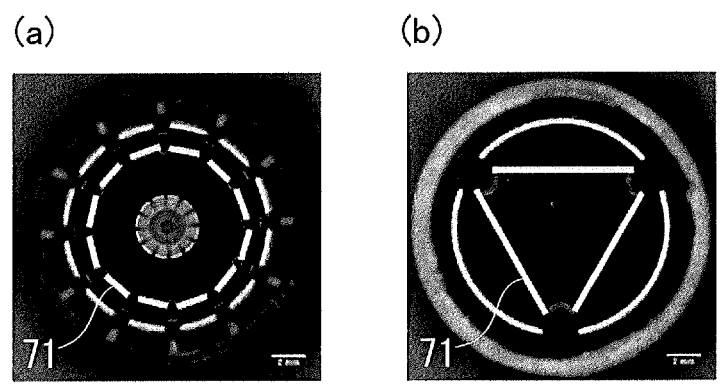
FIG. 18 shows images used to measure areas $S2_{min}$ of ventilation assemblies produced in EXAMPLES.

A picture of the external member 4 was taken in such a manner that the cross-sections having the smallest areas were included. Next, the obtained image was imported in image analysis software ImageJ, which can measure dimensions in images, and the scale was set for the image data so as to match the dimensions (actual measured values) of the ventilation assembly. Then, the dimensions of the cross-sections having the smallest areas were measured using the image analysis software, and the area $S2_{min}$ was calculated. Table 2 shows the result of calculating $S2_{min}$. As examples, FIG. 18 shows images used to measure $S2_{min}$ of the ventilation assemblies A and B. In FIG. 18, (a) shows the ventilation assembly A and (b) shows the ventilation assembly B. A white line 71 in each image corresponds to one of the cross-sections having the smallest areas.

Next, the ventilation assemblies were each measured for the total area $S2_{out}$ of a plane(s) being a cross-section(s) each taken at a position where the second space is the narrowest when the second space is observed from the other end portion side (the lower side) along the central axis of the ventilation assembly. The measurement operation was specifically as follows.

Figure 19:
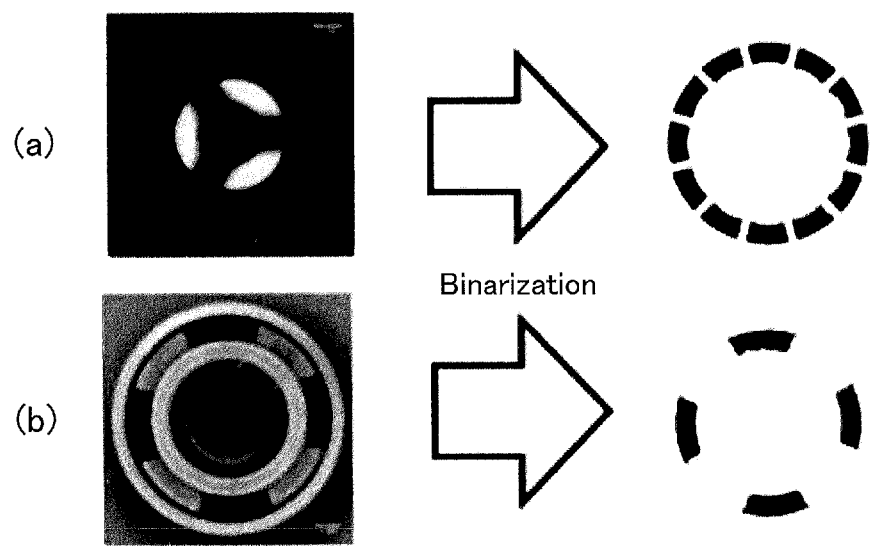
FIG. 19 shows images used to measure areas $S2_{out}$ of ventilation assemblies produced in EXAMPLES.
Figure 20:
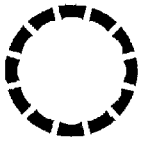
FIG. 20 shows post-binarization images used to measure areas $S2_{out}$ of ventilation assemblies produced in EXAMPLES.
Figure 20:
Figure 20:
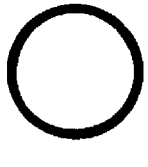
Figure 20:
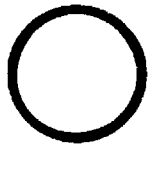
Figure 20:
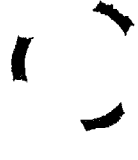

A picture of the bottom face of each of the ventilation assemblies was taken. Then, the obtained image was imported in image analysis software ImageJ. The image resolution was set to 8 bits, the contrast was adjusted so that the end portion of the ventilation assembly on the bottom side could be clearly shown, and the scale was set for the image data so as to match the dimensions (actual measured values) of the ventilation assembly. Next, a threshold for binarization was set so that only a plane(s) being a cross-section(s) each taken at a position where the ventilation path is the narrowest would be extracted, and an image in which only the end portion was shown in black was created. A portion which was not the end portion but turned black was deleted to complete the image. As examples, FIG. 19 shows images used to measure $S2_{out}$ of the ventilation assemblies A and B and post-binarization images of the ventilation assemblies A and B. In FIG. 19, (a) shows the ventilation assembly A and (b) shows the ventilation assembly B. FIG. 20 shows post-binarization images of the ventilation assemblies. Subsequently, the area of the black portion in the image was measured using the image analysis software, and the area $S2_{out}$ was calculated. Table 2 shows the results of calculating $S2_{out}$.

In the same manner as in the above-described <Moisture permeation test 1 of ventilation housing>, a ventilation assembly-attached housing lid was prepared with each of the ventilation assemblies and subjected to the moisture permeation test. Table 2 shows the results of measuring the moisture permeation rate. The projection 52 had an outer diameter of 8.5 mm, an inner diameter of 5.0 mm, and a height of 6.0 mm. The cross-sectional area S1 of the first space taken along a plane perpendicular to the central axis of the projection 52 was 19.6 mm².

more, the moisture permeation rate is improved with increasing ratio $S2_{out}/S1$.

Pull-Out Test for Internal Member

Example 10

An internal member 2 having the shape shown in FIG. 13A was produced by injection molding using an olefin-based thermoplastic elastomer (MILASTOMER (registered trademark) manufactured by Mitsui Chemicals, Inc.; hardness: 71; density: 880 kg/m³) as a material. The obtained internal member 2 had a thickness of 4.2 mm at a portion having the protruding portion 21, a thickness of 2.3 mm at a portion not having the protruding portion 21 (a non-protruding portion), an outer diameter of 16 mm at a portion having the protruding portion 21, an outer diameter of 12 mm at a non-protruding portion, an inner diameter of 7.5 mm, and a height H1 of 6.0 mm.

Figure 22:
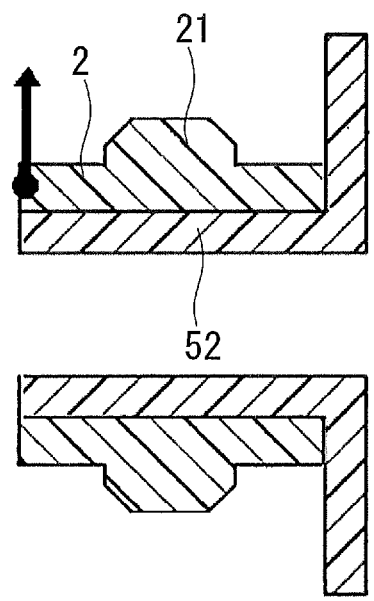
FIG. 22 is a schematic view for illustrating a pullout test for an internal member.

Next, a projection 52 made of polypropylene (PP) was prepared as the tubular projection 52 that can be included in a housing (refer to FIG. 22). The projection 52 had an outer diameter of 8.5 mm, an inner diameter of 5.0 mm, and a height H2 of 6.0 mm.

A hole was made with a 0.5-mm-diameter pin at an upper portion (on the side opposite to the side from which the projection was to be inserted) of the internal member 2, and a clip was passed through the hole. Then, the projection (height: 6.0 mm) was inserted to the end of the internal member (height: 6.0 mm).

Figure 23:
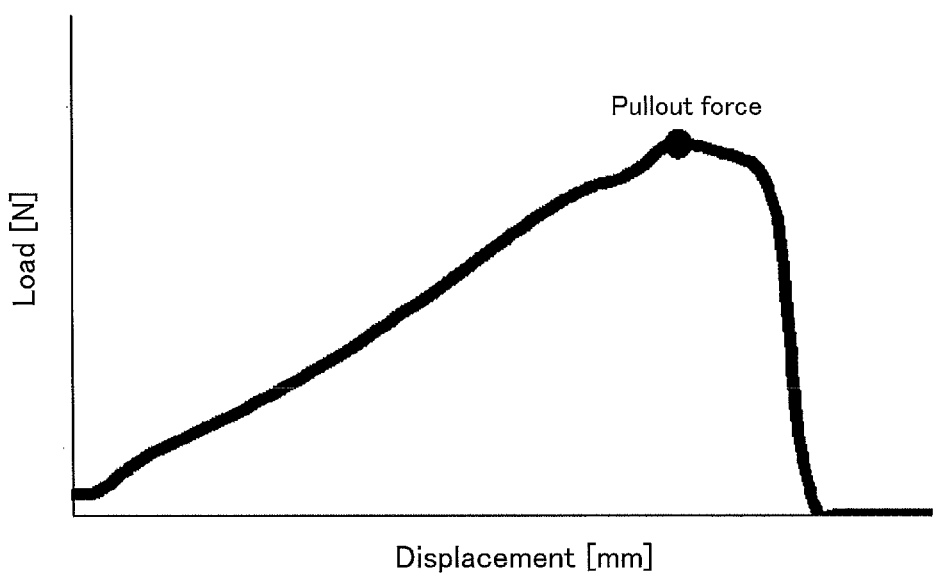
FIG. 23 is a graph showing an SS curve obtained in a pullout test for an internal member.

Next, the clip was fixed to one grip of a tensile tester (Autograph AGS-X manufactured by Shimadzu Corporation), and the projection was fixed to the other grip in such a manner that the direction in which the projection had been inserted in the internal member 2 was perpendicular to a displacement direction of the tensile tester. After that, a tensile test was performed at a tensile speed of 200 mm/min. A test in which the projection 52 is pulled out from the internal member 2 was thus performed (refer to FIG. 22). FIG. 23 shows an SS curve obtained from the tensile test.

TABLE 2

| | Ventilation assembly | Area S1 [mm²] | Area $S2_{min}$ [mm²] | Area $S2_{out}$ [mm²] | Ratio $S2_{min}/S1$ | Ratio $S2_{out}/S1$ | Moisture permeation rate [gm⁻²h⁻¹] |
|---|---|---|---|---|---|---|---|
| Example 5 | A | 19.6 | 21.7 | 44.1 | 1.1 | 2.2 | 57.5 |
| Example 6 | B | | 23.9 | 26.7 | 1.2 | 1.4 | 49.0 |
| Example 7 | C | | 6.3 | 47.7 | 0.3 | 2.4 | 42.4 |
| Example 8 | D | | 22.4 | 50.7 | 1.1 | 2.6 | 68.8 |
| Example 9 | E | | 19.2 *(25.4) | 19.2 | 1.0 *(1.3) | 1.0 | 42.4 |

*The area $S2_{min}$ of the ventilation assembly E is equal to the area $S2_{out}$ thereof. The values in the parentheses respectively represent the total area of cross-sections each taken at a position where the total area is the second smallest to the area $S2_{out}$ and the ratio of the total area to S1.

Figure 21:
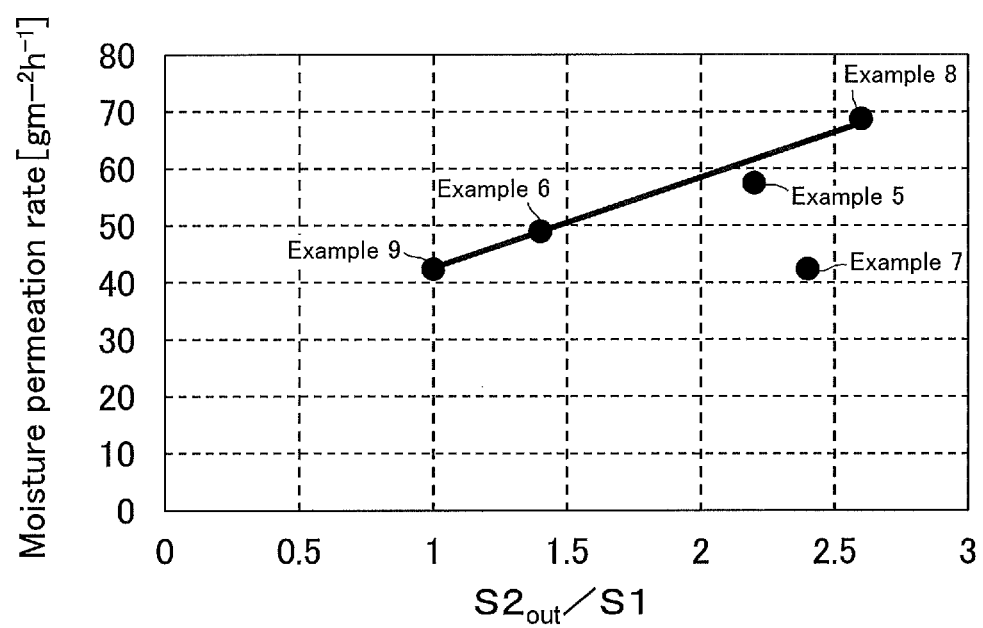
FIG. 21 is a graph on which a relation between ratios $S2_{out}/S1$ and moisture permeation rates is plotted for Examples 5 to 9.

For Examples 5 to 9, FIG. 21 shows a graph on which a relation between the ratios $S2_{out}/S1$ and the moisture permeation rates is plotted. It has been confirmed that in Examples 5, 6, 8, and 9 in which the ratio $S2_{min}/S1$ is 1.0 or The maximum load value on the SS curve was defined as the pullout force (horizontal pullout force) of the internal member 2. Table 3 shows the result of measuring the pullout force.

Examples 11 to 24 and Comparative Examples 10 to 23

A tensile test (pullout test for internal member) was performed in the same manner as in Example 10, except that the height H1 of the internal member 2 and the height H2 of the projection 52 were changed to the values shown in Table 3. Table 3 shows the results of measuring the pullout force.

tends to decrease significantly. It has been confirmed that the ventilation housings in which the height H1 of the internal member is 6 mm or more and 10 mm or less and the ratio H1/H2 of the height H1 of the internal member to the height H2 of the projection is 1.00 or more and 1.70 or less are such excellent ventilation housings that both the moisture permeation performance and the pullout resistance are achieved.

TABLE 3

| | Height H1 of internal member [mm] | Height H2 of projection [mm] | Ratio H1/H2 | Pullout force [N] | Phenomenon caused by tensile test |
|---|---|---|---|---|---|
| Example 10 | 6 | 6 | 1.0 | 44.1 | Internal member not pulled apart and broken |
| Example 11 | | 5 | 1.2 | 22.7 | Internal member pulled apart |
| Example 12 | | 4 | 1.5 | 11.5 | Internal member pulled apart |
| Comparative Example 10 | | 3 | 2.0 | 0.5 | Internal member pulled apart |
| Example 13 | 7 | 7 | 1.0 | 34.8 | Internal member not pulled apart and broken |
| Example 14 | | 6 | 1.2 | 31.3 | Internal member pulled apart |
| Example 15 | | 5 | 1.4 | 22.2 | Internal member pulled apart |
| Comparative Example 11 | | 4 | 1.8 | 9.6 | Internal member pulled apart |
| Comparative Example 12 | | 2 | 3.5 | 2.4 | Internal member pulled apart |
| Example 16 | 8 | 8 | 1.0 | 42.6 | Internal member not pulled apart and broken |
| Example 17 | | 6 | 1.3 | 25.8 | Internal member pulled apart |
| Example 18 | | 5 | 1.6 | 19.4 | Internal member pulled apart |
| Comparative Example 13 | | 4 | 2.0 | 7.6 | Internal member pulled apart |
| Comparative Example 14 | | 2 | 4.0 | 3.4 | Internal member pulled apart |
| Example 19 | 9 | 9 | 1.0 | 42.6 | Internal member not pulled apart and broken |
| Example 20 | | 8 | 1.1 | 44.4 | Internal member not pulled apart and broken |
| Example 21 | | 6 | 1.5 | 24.4 | Internal member pulled apart |
| Comparative Example 15 | | 4 | 2.3 | 8.5 | Internal member pulled apart |
| Comparative Example 16 | | 2 | 4.5 | 2.7 | Internal member pulled apart |
| Example 22 | 10 | 10 | 1.0 | 48.4 | Internal member not pulled apart and broken |
| Example 23 | | 8 | 1.3 | 40.8 | Internal member not pulled apart and broken |
| Example 24 | | 6 | 1.7 | 24.8 | Internal member pulled apart |
| Comparative Example 17 | | 4 | 2.5 | 5.6 | Internal member pulled apart |
| Comparative Example 18 | | 2 | 5.0 | 3.2 | Internal member pulled apart |
| Comparative Example 19 | 12 | 10 | 1.2 | 41.5 | Internal member not pulled apart and broken |
| Comparative Example 20 | | 8 | 1.5 | 41.0 | Internal member pulled apart |
| Comparative Example 21 | | 6 | 2.0 | 19.2 | Internal member pulled apart |
| Comparative Example 22 | | 4 | 3.0 | 6.0 | Internal member pulled apart |
| Comparative Example 23 | | 2 | 6.0 | 1.9 | Internal member pulled apart |

Figure 24:
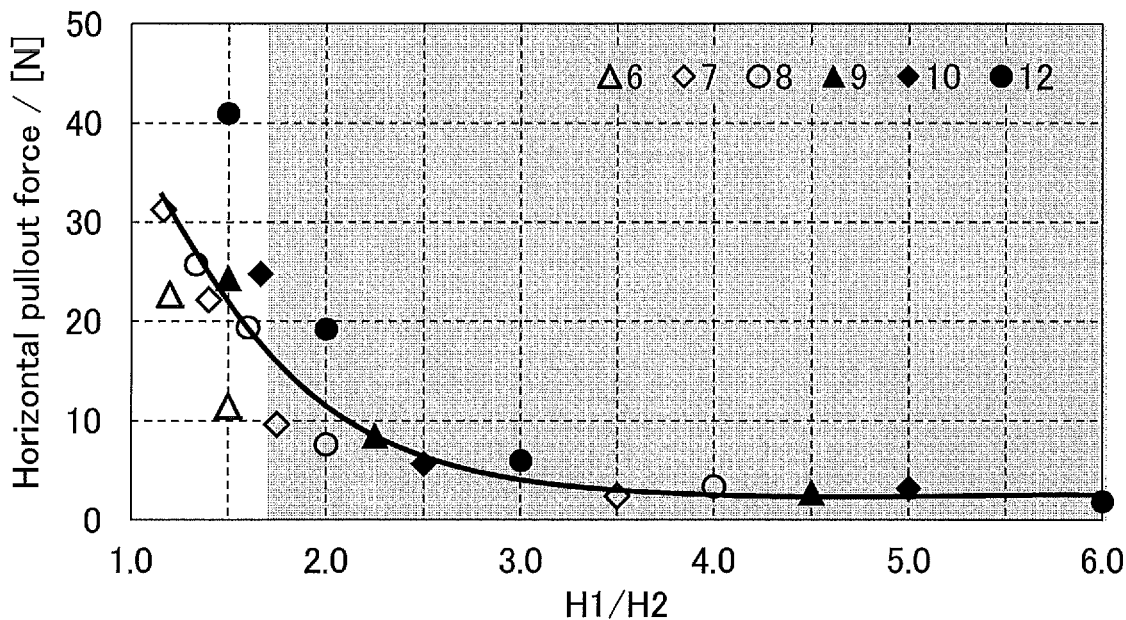
FIG. 24 is a graph on which a relation between ratios H1/H2 and pullout forces is plotted for Examples and Reference Examples in which internal members were pulled apart without being broken in a pullout test for the internal members.

For Examples and Comparative Examples in which the internal members 2 were pulled apart without being broken, FIG. 24 shows a graph on which a relation between the ratios H1/H2 and the pullout forces is plotted. The values in the legend of the graph represent the heights H1 of the internal members 2. It is clearly shown in FIG. 24 that when the ratio H1/H2 of the height H1 of the internal member to the height H2 of the projection is more than 1.70, the pullout force Pullout Test for External Member Reference Example 1

An internal member 2 having the shape shown in FIG. 13A was produced by injection molding using an olefin-based thermoplastic elastomer (MILASTOMER (registered trademark) manufactured by Mitsui Chemicals, Inc.; hardness: 71; density: 880 kg/m$^3$) as a material. The obtained internal member 2 had a thickness of 4.2 mm at a portion having the protruding portion 21, a thickness of 2.3 mm at a portion not having the protruding portion 21 (a non-protruding portion), an outer diameter of 16 mm at a portion having the protruding portion 21, an outer diameter of 12 mm at a non-protruding portion, an inner diameter of 7.5 mm, and a height H1 of 6.0 mm.

An external member 4 having the shape shown in FIGS. 13A and 13B was produced by injection molding using polypropylene (manufactured by Japan Polypropylene Corporation) as a material. The obtained external member 4 had a thickness of 1.0 mm, an outer diameter of 17.5 mm, an inner diameter of 15.6 mm, and a height of 12 mm.

Next, a projection 52 made of polypropylene (PP) was prepared as the tubular projection 52 that can be included in a housing (refer to FIG. 22). The projection had an outer diameter of 8.1 mm, an inner diameter of 5.0 mm, and a height H2 of 10 mm.

Next, a hole was made at the bottom portion 32 (on the side opposite to the side from which the internal member 2 was to be inserted) of the external member 4, and a screw was passed through the hole. Then, the internal member 2 was press-fitted (inserted) into the external member 4 (insertion depth of external member 4: 10 mm) to obtain a ventilation assembly. The projection was inserted in the internal member 2 in such a manner that the projection (height: 10 mm) was pushed all the way in the ventilation assembly.

Figure 25:
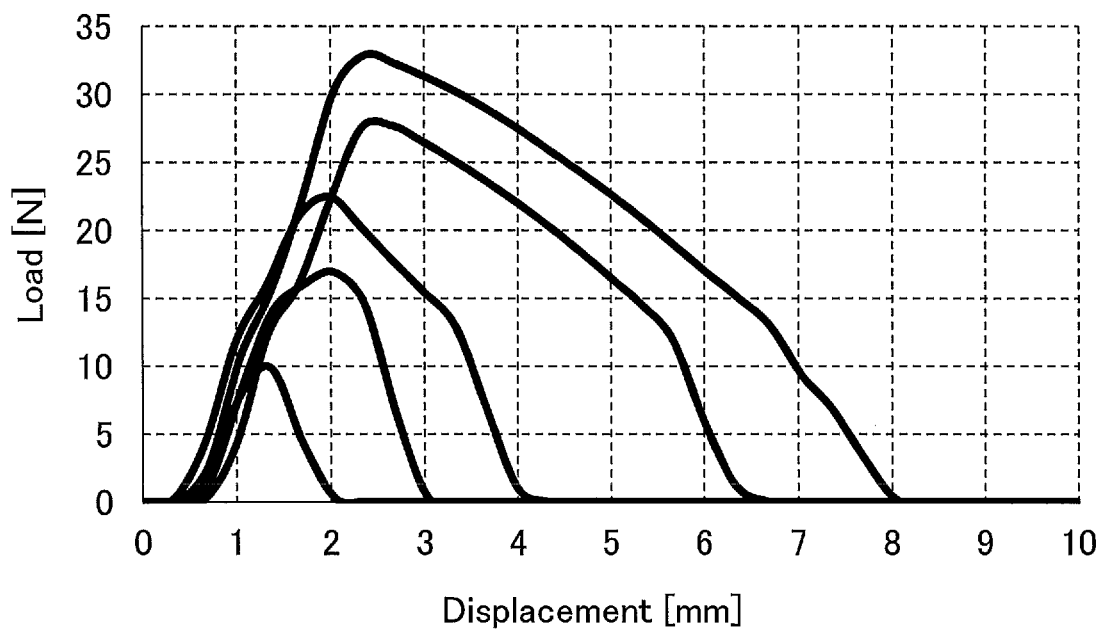
FIG. 25 is a graph showing SS curves obtained in a pullout test for external members.

Next, the screw was fixed to one grip of a tensile tester (Autograph AGS-X manufactured by Shimadzu Corporation), and the projection was fixed to the other grip in such a manner that a displacement direction of the tensile tester coincided with the direction in which the projection had been inserted in the ventilation assembly. After that, a tensile test was performed at a tensile speed of 200 mm/min. A test in which the external member 4 is pulled out from the ventilation assembly was thus performed. FIG. 25 shows examples of SS curves obtained from the tensile test. The maximum load values on the SS curves were defined as the pullout forces of the external members 4. Table 4 shows the results of measuring the pullout force. FIG. 25 shows the SS curves of Reference Examples Nos. 2, 3, 4, 5, and 6 in order of decreasing maximum load values.

Reference Examples 2 to 12

A tensile test (pullout test for external member) was performed in the same manner as in Reference Example 1, except that the outer diameter of the projection, the height of the external member, and the insertion depth of the external member were changed to the values shown in Table 4. Table 4 shows the results of measuring the pullout force. The terms "insertion depth of external member" and "inside-outside contact length" in Table 4 are as described in <Moisture permeation test 1 of ventilation housing>.

TABLE 4

| Reference Example No. | Height of internal member [mm] | Height of projection [mm] | Outer diameter of projection [mm] | Height of external member [mm] | Insertion depth of external member [mm] | Inside-outside contact length [mm] | Pullout force [N] |
|---|---|---|---|---|---|---|---|
| 1 | 12 | 10 | 8.1 | 12 | 10 | 5.5 | 31.40 |
| 2 | | | | | 9 | 5.5 | 32.90 |
| 3 | | | | | 8 | 5.5 | 27.69 |
| 4 | | | | | 7 | 5.5 | 22.45 |
| 5 | | | | | 6 | 5.5 | 16.93 |
| 6 | | | | | 5 | 5 | 9.87 |
| 7 | | | 8.5 | 12 | 10 | 5.5 | 37.86 |
| 8 | | | | | 9 | 5.5 | 36.31 |
| 9 | | | | | 8 | 5.5 | 32.46 |
| 10 | | | | | 7 | 5.5 | 27.28 |
| 11 | | | | | 6 | 5.5 | 19.36 |
| 12 | | | | | 5 | 5 | 9.19 |

Figure 26:
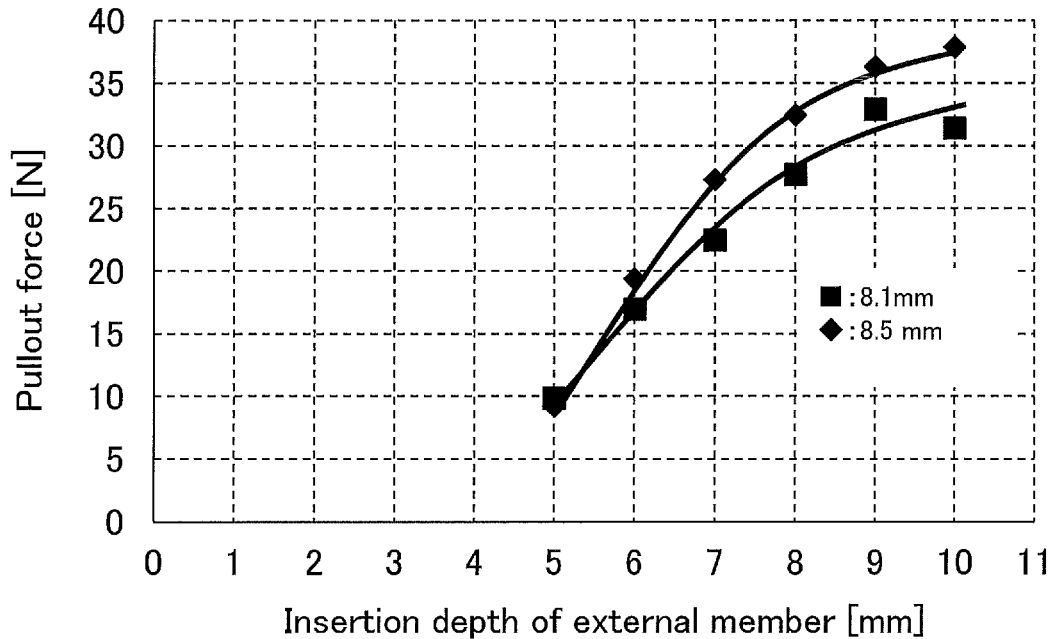
FIG. 26 is a graph on which a relation between insertion depths of external members and pullout forces is plotted for Reference Examples.

It is clear from the results of the SS curves that the maximum load in the tensile test (pullout test for external member) increases with increasing insertion depth of the external member. For Reference Examples, FIG. 26 shows a graph on which a relation between the insertion depths of the external members and the pullout forces is plotted. The values in the legend in FIG. 26 represent the outer diameters of the projections. It has been confirmed that as shown in FIG. 26, the insertion depth of the external member greatly affects the pullout force (the pullout force required to pull apart the external member from the internal member).

Figure 27:
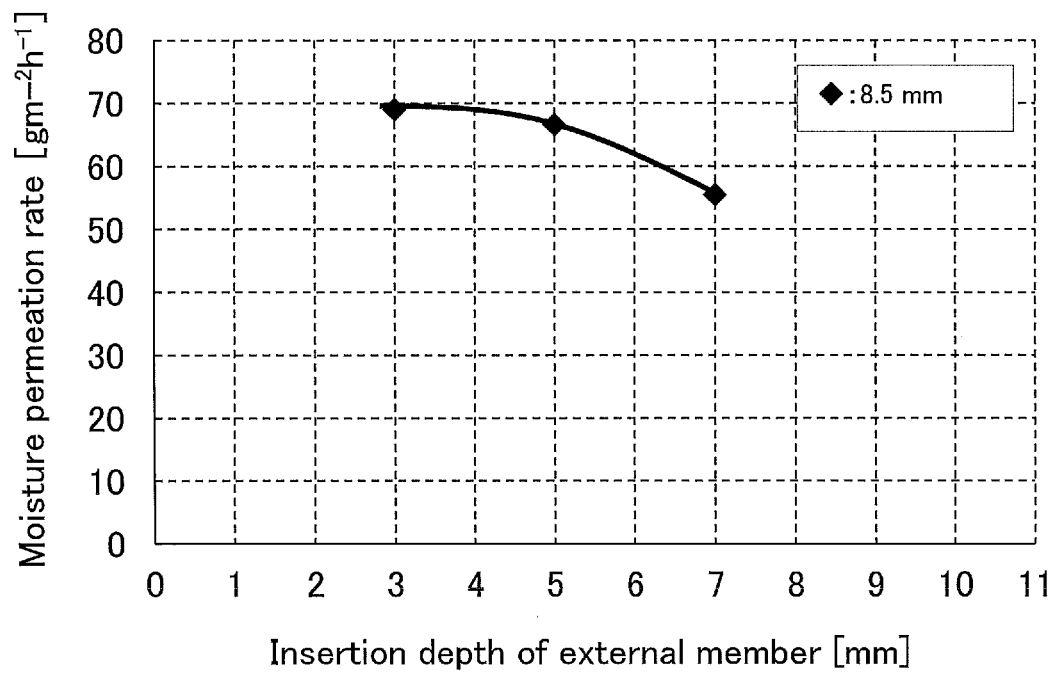
FIG. 27 is a graph on which a relation between insertion depths of external members and moisture permeation rates is plotted for Comparative Examples 1 to 3.
Figure 28:
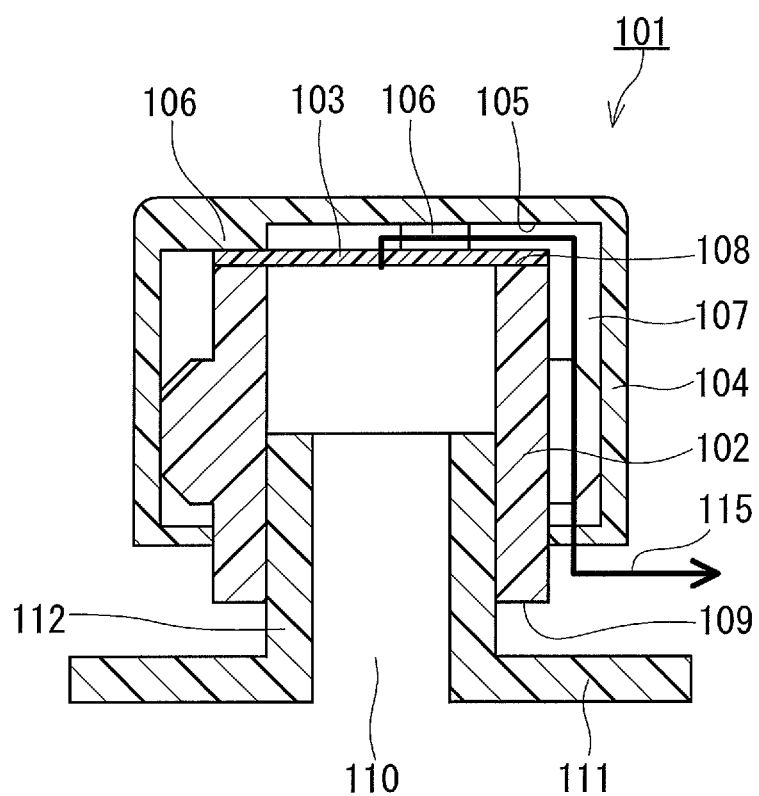
FIG. 28 is a cross-sectional view schematically showing an example of a conventional ventilation assembly.

For Comparative Examples 1 to 3 in the above-described <Moisture permeation test 1 of ventilation housing>, FIG. 27 shows a graph on which a relation between the insertion depths of the external members and the moisture permeation rates is plotted. The value in the legend in FIG. 27 represents the outer diameters of the projections.

INDUSTRIAL APPLICABILITY

The ventilation housing of the present invention can be used in the same applications as conventional ventilation housings.

The invention claimed is:

1. A ventilation housing comprising:
a housing; and
a ventilation assembly, wherein
the housing comprises a tubular projection extending to project from an outer surface of the housing and internally having a first space communicating an inside and an outside of the housing,
the ventilation assembly comprises:
an internal member being a tubular body having an opening at a first end portion and an opening at a second end portion;
a gas-permeable membrane covering the opening at the first end portion of the internal member; and
an external member being a tubular body having a bottom, the external member being joined to the internal member with the internal member inserted in an interior of the external member from the first end portion side, the ventilation assembly is fixed to the projection with the projection inserted in the opening at the second end portion of the internal member to make an inner peripheral surface of the internal member and an outer peripheral surface of the projection abut each other, the ventilation assembly has a second space serving as a ventilation path connecting the gas-permeable membrane and the outside of the ventilation assembly in at least one selected from an inside of the internal member, an inside of the external member, and an interspace between the internal member and the external member joined together, a height H1 of the internal member is 6.0 mm or more and 10 mm or less, and a ratio H1/H2 of the height H1 of the internal member to a height H2 of the projection is 1.00 or more and 1.70 or less.

2. The ventilation housing according to claim 1, wherein a ratio $S2_{min}/S1$ between an area S1 of a cross-section of the first space taken along a plane perpendicular to a central axis of the projection and a smallest total area $S2_{min}$ determined by comparison of values of different total areas determined at different distances from the gas-permeable membrane is 1.0 or more, the total areas each being determined for a cross-section of the second space taken along a plane perpendicular to a ventilation direction in the ventilation path, the cross-section being located at a certain distance from the gas-permeable membrane.

3. The ventilation housing according to claim 1, wherein a ratio $S2_{out}/S1$ between an area S1 of a cross-section of the first space taken along a plane perpendicular to a central axis of the projection and a total area $S2_{out}$ of a plane consisting of a cross-section of the second space taken at a position where the second space is the narrowest when the second space is observed from the second end portion side along a central axis of the ventilation assembly is 1.0 or more.

4. The ventilation housing according to claim 1, wherein when the ventilation assembly is observed in a direction perpendicular to a central axis of the ventilation assembly, a length of a portion of the internal member in a direction along the central axis is 6.0 mm or more and 8.0 mm or less, the portion being covered by the external member.

5. The ventilation housing according to claim 1, wherein the external member and/or the internal member has a locking mechanism detachably joining the external member and the internal member together.

* * * * *